US010193573B2

(12) United States Patent
Goettfert

(10) Patent No.: US 10,193,573 B2
(45) Date of Patent: Jan. 29, 2019

(54) METHOD AND DATA PROCESSING DEVICE FOR DETERMINING AN ERROR VECTOR IN A DATA WORD

(71) Applicant: Infineon Technologies AG, Neubiberg (DE)

(72) Inventor: Rainer Goettfert, Putzbrunn (DE)

(73) Assignee: Infineon Technologies AG, Neubiberg (DE)

( * ) Notice: Subject to any disclaimer, the term of this patent is extended or adjusted under 35 U.S.C. 154(b) by 300 days.

(21) Appl. No.: 14/965,933

(22) Filed: Dec. 11, 2015

(65) Prior Publication Data
US 2016/0173133 A1 Jun. 16, 2016

(30) Foreign Application Priority Data
Dec. 12, 2014 (DE) .......................... 10 2014 118 531

(51) Int. Cl.
*H03M 13/15* (2006.01)
*H03M 13/00* (2006.01)

(52) U.S. Cl.
CPC ... *H03M 13/1575* (2013.01); *H03M 13/1565* (2013.01); *H03M 13/617* (2013.01)

(58) Field of Classification Search
CPC ......... H03M 13/1565; H03M 13/1575; H03M 13/617
See application file for complete search history.

(56) References Cited

U.S. PATENT DOCUMENTS

| | | | | |
|---|---|---|---|---|
| 3,622,985 A * | 11/1971 | Ayling | ................. | H03M 13/19 714/757 |
| 4,382,300 A | 5/1983 | Gupta | | |
| 4,648,091 A * | 3/1987 | Gajjar | ................. | H03M 13/15 714/755 |
| 2008/0126908 A1 * | 5/2008 | Lin | .................... | H03M 13/1108 714/758 |
| 2009/0287983 A1 * | 11/2009 | Truong | ............ | H03M 13/1575 714/785 |

(Continued)

OTHER PUBLICATIONS

Suh et al. "Physical Unclonable Functions for Device Authentication and Secret Key Generation;"IEEE, pp. 9-14, Jun. 2007.*
Sklar et al."The ABCs of linear block codes; IEEE, Jul. 2004.".*

*Primary Examiner* — Guy J Lamarre
(74) *Attorney, Agent, or Firm* — Viering, Jentschura & Partner MBB

(57) ABSTRACT

In various embodiments, a method for determining an error vector in a data word is provided. The method includes determining the syndrome of the error vector, successively generating code words by cyclically interchanging one or more predefined code words, forming, for each code word generated, the sum of the syndrome supplemented with zeros to the data word length and the code word, and checking, for the code word, whether the sum of the syndrome supplemented with zeros to the data word length and the code word has a minimum weight among all code words, and determining the error vector as the sum of the syndrome and the code word for which the sum of the syndrome supplemented with zeros to the data word length and the code word has a minimum weight among all code words.

20 Claims, 15 Drawing Sheets

(56) References Cited

U.S. PATENT DOCUMENTS

| | | | |
|---|---|---|---|
| 2010/0269025 A1* | 10/2010 | Chen | H03M 13/1105 714/785 |
| 2011/0040817 A1* | 2/2011 | Lazich | G06F 7/588 708/251 |
| 2014/0105403 A1* | 4/2014 | Baldi | H04L 9/0861 380/282 |
| 2017/0026057 A1* | 1/2017 | Goettfert | H03M 13/136 |

* cited by examiner

FIG 3
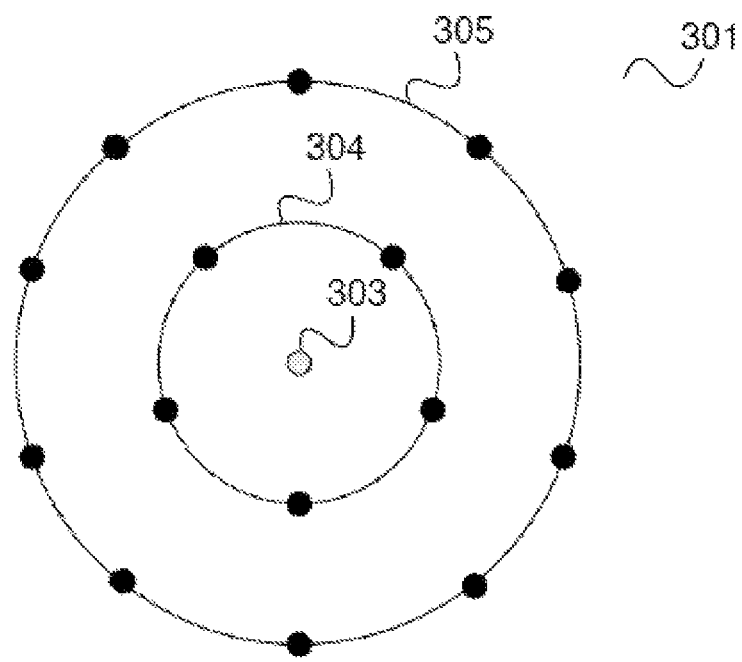
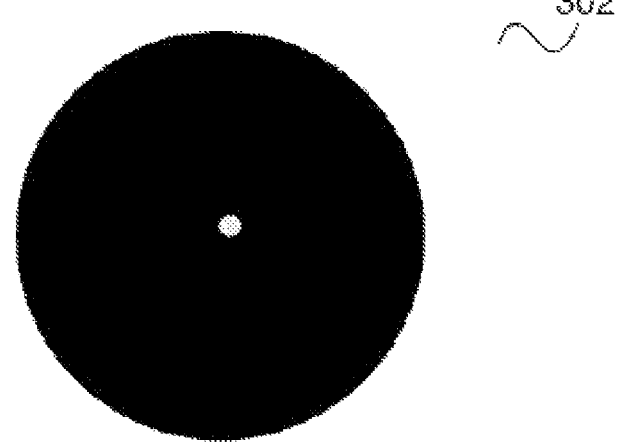

FIG 4
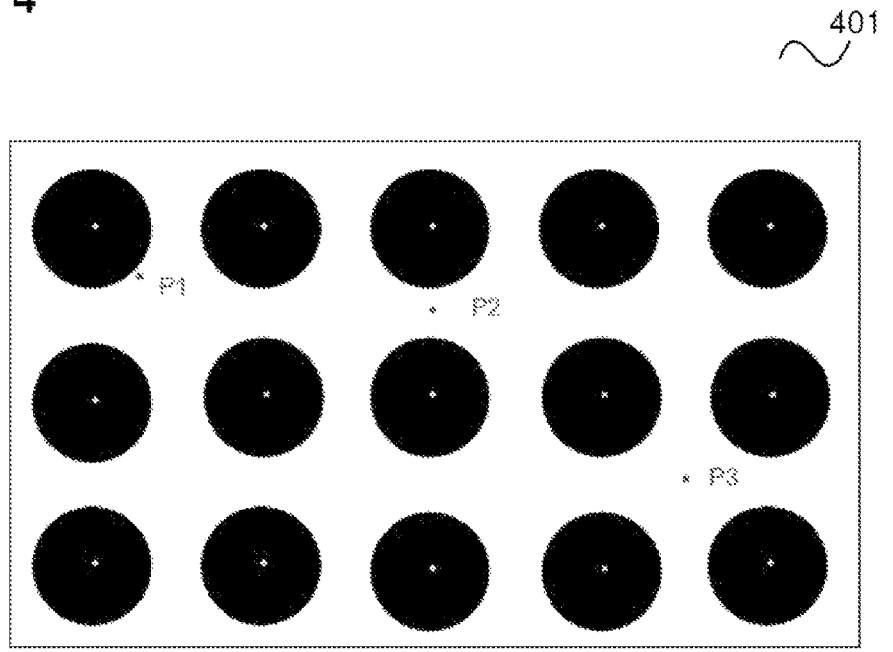
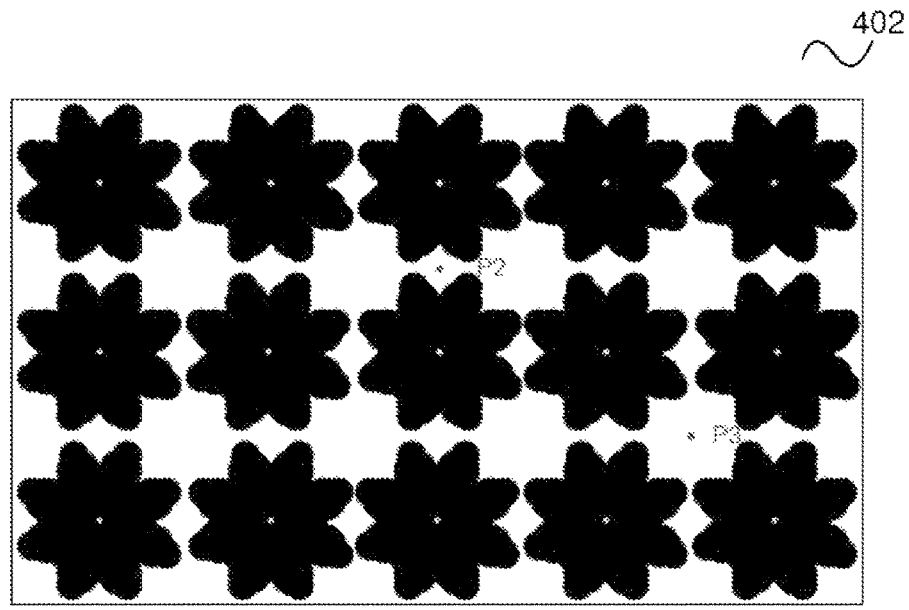

METHOD AND DATA PROCESSING DEVICE FOR DETERMINING AN ERROR VECTOR IN A DATA WORD

CROSS-REFERENCE TO RELATED APPLICATION

This application claims priority to German Patent Application Serial No. 10 2014 118 531.5, which was filed Dec. 12, 2014, and is incorporated herein by reference in its entirety.

TECHNICAL FIELD

Various embodiments relate generally to methods and data processing devices for determining an error vector in a data word.

BACKGROUND

In order to make it possible to correct errors in data which are produced, for example, during data transmission or storage or reading, data are typically coded by a code. Such a code can also be used, for example, to make it possible to reconstruct a value provided by a PUF (Physical Unclonable Function). In both cases, it is necessary to determine an error vector in a data word (for example a message or a PUF value). It is desirable for this determination to be carried out efficiently.

SUMMARY

In various embodiments, a method for determining an error vector in a data word is provided. The method includes determining the syndrome of the error vector, successively generating code words by cyclically interchanging one or more predefined code words, forming, for each code word generated, the sum of the syndrome supplemented with zeros to the data word length and the code word, and checking, for the code word, whether the sum of the syndrome supplemented with zeros to the data word length and the code word has a minimum weight among all code words, and determining the error vector as the sum of the syndrome and the code word for which the sum of the syndrome supplemented with zeros to the data word length and the code word has a minimum weight among all code words.

Furthermore, various embodiments provide a data processing device according to the method described above.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 3 shows two illustrations of a Hamming ball;

FIG. 4 shows a comparison of Hamming balls with super Hamming balls;

DESCRIPTION

Figure 1:
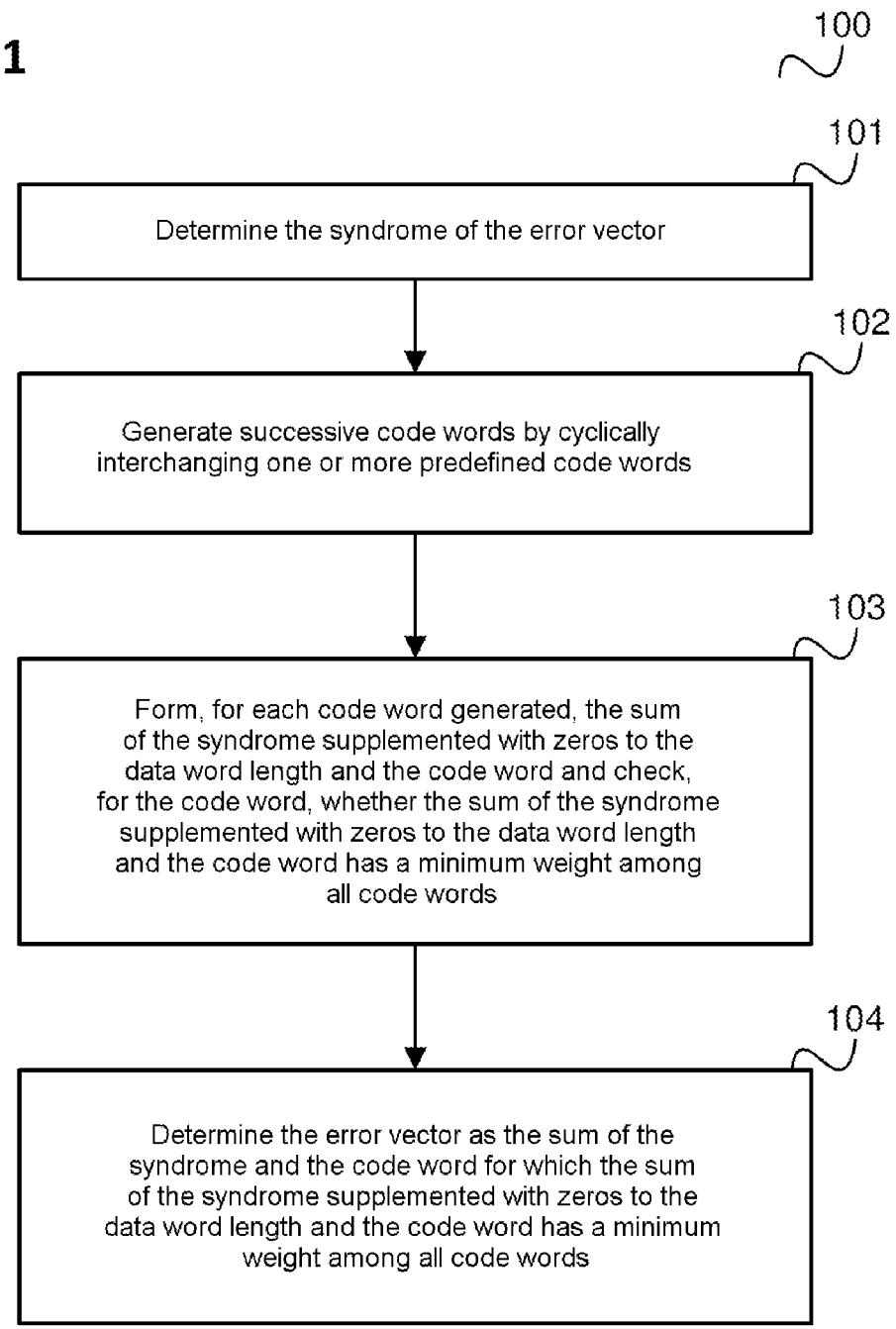
FIG. 1 shows a flowchart illustrating a method for determining an error vector in a data word.

The following detailed description relates to the accompanying figures which show details and embodiments. These embodiments are described in such detail that a person skilled in the art can carry out the invention. Other embodiments are also possible and the embodiments can be structurally, logically and electrically changed without departing from the subject matter of the invention. The various embodiments do not necessarily exclude one another, but rather different embodiments can be combined with one another, thus producing new embodiments. Within the scope of this description, the terms "linked", "connected" and "coupled" are used to describe both a direct and an indirect link, a direct or indirect connection and direct or indirect coupling.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

Embodiments are described below in which errors which occur when transmitting or storing data are corrected by an electric circuit (for example according to an algorithm). Further embodiments provide an electric circuit which can be considered to be related to such an electric circuit and makes it possible to reconstruct PUF (Physical Unclonable Function) values. According to various embodiments, high error rates (approximately 10%) are rendered correctable in this case.

The abbreviation PUF stands for "Physical Unclonable Function" or physical hash function. The idea here is to digitize physical properties of an object and thus obtain a bit sequence (number) assigned to the object. It is desirable here for the bit sequences of two different physical objects to be uncorrelated with one another. A simple illustrative example is a sheet of paper. Examination under a microscope reveals a specific fine structure of the wood chips or pulp parts. The structure can be measured by means of a suitable method and the result can be represented as a bit sequence. This bit sequence is the PUF or PUF value for the sheet. With this procedure, a different sheet of paper generally produces a bit sequence that is uncorrelated with the bit sequence of the first sheet.

The process for generating a bit sequence (the PUF value) from the properties of the physical object is referred to as PUF generation. It is desirable for the PUF generation to be possible in an efficient manner.

One desirable property of a PUF generation mechanism is that the same physical object produces the same bit sequence each time with each PUF generation (e.g. with each PUF request). However, this is typically not the case. A repeated PUF generation for the same physical object typically provides bit sequences which are very similar to one another but are not generally identical to one another. This shortcoming can be made good using coding theory (error correction) methods.

The following procedure, for example, is carried out here: A physical object is assumed. The first PUF bit sequence A assigned to the object is generated, A being designated as the true PUF value. An associated auxiliary vector (also referred to as auxiliary information) b is calculated from the true PUF value A. The auxiliary vector b is regarded as publicly accessible information. For example, b is stored in a non-secure environment. The true PUF value A itself is secret and is not stored at all and is therefore also not directly available. In a subsequent, new PUF generation, a new PUF value A' is obtained. The value A' is generally not identical to A, but differs only slightly from A. The aim is to recover the true PUF value A by reconstructing it from the available current PUF value A'. The stored auxiliary data b are used here.

FIG. 1 shows a flowchart 100.

The flowchart 100 illustrates a method for determining an error vector in a data word.

In 101, the syndrome of the error vector is determined.

In 102, successive code words are generated by cyclically interchanging one or more predefined code words.

In 103, the sum of the syndrome supplemented with zeros to the data word length and the code word is formed for each code word generated and a check is carried out, for the code word, in order to determine whether the sum of the syndrome supplemented with zeros to the data word length and the code word has a minimum weight among all code words.

In 104, the error vector is determined as the sum of the syndrome and the code word for which the sum of the syndrome supplemented with zeros to the data word length and the code word has a minimum weight among all code words.

In other words, the cyclical interchanges of a code word are run through, each cyclical interchange is added to the syndrome (which is suitably supplemented with zeros to the code word length) and it is determined, for each cyclical interchange, whether its sum with the syndrome has a minimum weight. If this is the case, the sum is used as the error vector.

If the zero word is a code word, for example in the case of a linear code, the minimum can also be assumed for the syndrome itself (that is to say for the sum of the zero word and the syndrome). In this case, the error vector is therefore determined by supplementing the syndrome with zeros to the data word length. For example, it is possible to check in advance whether the Hamming weight of the syndrome is less than half the Hamming distance of the code and in this case to determine the error vector as the supplemented syndrome before further code words are generated (by cyclically interchanging a code word).

The cyclical interchanging of a code word can be understood as meaning the cyclical permutation of a code word. For example, the code word is stored in a shift register whose last storage element (for example flip-flop) is connected to the first storage element, with the result that a bit pushed out at one end is pushed into the shift register at the other end.

According to one embodiment, the method also includes correcting the data word by the error vector.

According to one embodiment, the method also includes outputting the corrected data word to a processing device.

The data word is, for example, a message word coded with the code.

The method may also include receiving the data word from a transmitter.

The syndrome of the error vector is the syndrome of the data word, for example.

The data word may also be a PUF word.

The method may also include, for example, receiving the data word from a circuit which implements a PUF.

The syndrome of the error vector is, for example, the sum of the syndrome of the data vector and an auxiliary vector.

The auxiliary vector is, for example, the syndrome of a PUF word which is determined during initialization and differs from the data word by the error vector.

According to one embodiment, the process of checking whether the sum of the syndrome supplemented to the data word length and the code word has a minimum weight includes checking whether the weight of the sum is less than half the Hamming distance of the code.

According to one embodiment, the method includes aborting the successive generation of words in the set if a code word has been found for which the weight of the sum is less than half the Hamming distance of the code.

According to one embodiment, the process of checking whether the sum of the syndrome supplemented to the data word length and the word has a minimum weight includes determining, for all code words generated, the sum of the syndrome supplemented to the data word length and the code word and comparing the determined sums.

According to one embodiment, the method also includes determining the data word as not being correctable if the sum of the syndrome supplemented with zeros to the data word length and the code word does not have a minimum weight among all code words for a code word.

The syndrome is supplemented with zeros to the data word length according to a control matrix, for example, which has just as many unit vectors as the syndrome has components.

For example, the syndrome is supplemented with zeros to the data word length according to a control matrix which has a unit matrix having the number of rows equal to the number of components of the syndrome.

The process of supplementing the syndrome with zeros to the data word length includes, for example, inserting zeros into the syndrome at positions which correspond to columns of the control matrix which are not unit vectors.

According to one embodiment, the code is a cyclical code.

According to one embodiment, the code consists of the zero word and all cyclical interchanges of a code word not equal to the zero word.

The code words are generated, for example, by cyclically interchanging a single code word.

The code is a simplex code, for example.

Figure 2:
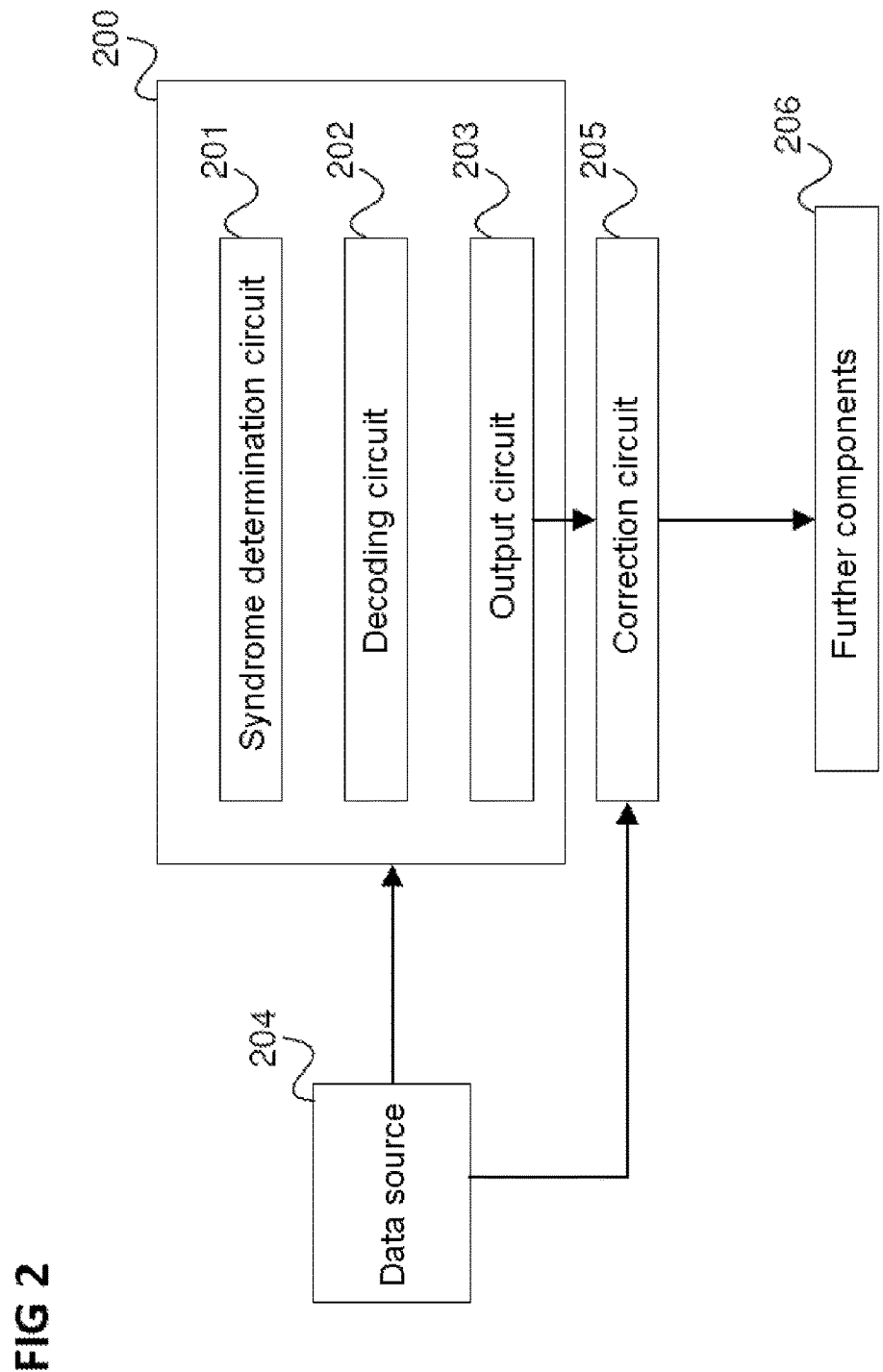
FIG. 2 shows a data processing device for determining an error vector in a data word according to one embodiment.

The method illustrated in FIG. 1 is carried out, for example, by an apparatus illustrated in FIG. 2.

FIG. 2 shows a data processing device 200 for determining an error vector in a data word according to one embodiment.

The data processing device 200 has a syndrome determination circuit 201 which is set up to determine the syndrome of the error vector.

The data processing device 200 also has a decoding circuit 202 which is configured to successively generate code words by cyclically interchanging one or more predefined code words, to form, for each code word generated, the sum of the syndrome supplemented with zeros to the data word length and the code word, and to check, for the code word, whether the sum of the syndrome supplemented with zeros to the data word length and the code word has a minimum weight among all code words.

The data processing device 200 also has an output circuit 203 which is configured to output the sum of the syndrome and the code word, for which the sum of the syndrome supplemented with zeros to the data word length and the code word has a minimum weight among all code words, as the error vector.

The data processing device receives the data vector, for example a PUF value or a message vector, for example from a data source 204. The error vector is received, for example, by a correction circuit 205 for correcting the data vector, which correction circuit forwards the data word to further components 206 (for further processing) after correction.

The components of the data processing device (for example the syndrome determination circuit, the decoding circuit and the output circuit) may be implemented by one or more electric circuits or (partial) circuits. In one embodiment, an "electric circuit" or a "circuit" can be understood as meaning any unit which implements logic and may be hardware, software, firmware or a combination thereof. In one embodiment, an "electric circuit" or a "circuit" may therefore be a hard-wired electric logic circuit or a programmable electric logic circuit, for example a programmable processor. An "electric circuit" or a "circuit" can also be understood as meaning a processor which executes software. In one embodiment, an "electric circuit" or a "circuit" can be understood as meaning any type of implementation of the functions described below.

Embodiments are described in more detail below.

The embodiments described below are based on a binary linear (n, k, d) code. The parameters have the following meaning:

n is the length of a code word in bits;
k is the dimension of the code, that is to say the code consists of $2^k$ code words;
d is the minimum distance of the code.

The set of all code words is denoted using the letter C and is called code.

A binary linear (n, k, d) code is a k-dimensional subspace of the vector space $V_n = F_2^n$ (also referred to as $GF(2)^n$).

The vector space $V_n$ consists of all binary vectors of the length n, also referred to as n-bit words.

Let $v \in V_n$. The vector notation for v is $v=(v_0, v_1, \ldots, v_{n+1})$. The word notation for v is $v=v_0 v_1 \ldots v_{n-1}$.

The Hamming weight w(v) of a vector from $V_n$ is the number of ones in v. The Hamming distance between two vectors u and v from $V_n$ is the number of coordinate locations at which u and v have different entries. In the case of a linear code, the Hamming distance d(u, v) between two vectors u, $v \in V_n$ is equal to the Hamming weight of the sum vector u+v.

Example: let u=1000 and v=1010. Then d(u, v)=1. The (Hamming) weight of the sum u+v=0010 is w(u+v)=1. Furthermore, w(u)=1 and w(v)=2.

When coding a message using a binary linear (n, k, d) code, k message bits $a_0, a_1, \ldots, a_{k-1}$ can be freely selected. Then, r=n−k control bits $b_k, b_{k+1}, \ldots, b_{n-1}$ are calculated for the k message bits (in accordance with a calculation rule corresponding to the code). The control bits are appended to the message bits, thus producing a code word $c \in C$: $c = a_0 a_1 \ldots a_{k-1} b_k b_{k+1} \ldots b_{n-1}$.

There are $2^k$ different code words corresponding to the $2^k$ possibilities for selecting the k message bits.

Let $C=\{c_1, c_2, \ldots, c_M\}$ be a binary linear (n, k, d) code, where $M=2^k$. The minimum distance d of the code C is the smallest possible Hamming distance which two different code words from C may have with respect to one another. The following therefore applies: $d(c_i, c_j) \geq d$ for $1 \leq i < j \leq M$.

For linear codes, the minimum distance d of the code may also be described by the Hamming weights of the code words of C: the minimum distance d is the smallest Hamming weight among all code words of C which are different from 0. That is to say: $w(c_i) \geq d$ for all $c \in C$ with $c \neq 0$.

A Hamming ball B(c, r) around a code word $c \in C \subseteq V_n$ with a radius of $r \geq 0$ is the set of all vectors from $V_n$ whose Hamming distance from c is less than or equal to r. That is to say: $B(c, r) = \{x \in V_n : d(x, c) \leq r\}$.

Example: let C be a code of length n=5. That is to say $C \subseteq V_5 = F_2^5$. Let c=11000 be a code word. There is then a vector $x \in V_5$ with d(x, c)=0, namely x=c. There are five vectors $x \in V_5$ with d(x, c)=1, namely: $x_1=01000$, $x_2=10000$, $x_3=11100$, $x_4=11010$, $x_5=11001$.

There are $$\binom{5}{2} = 10$$

vectors $x \in V_5$ with d(x, c)=2. These are the ten vectors: $x_{1,2}=00000$, $x_{1,3}=01100$, $x_{1,4}=01010$, $x_{1,5}=01001$, $x_{2,3}=10100$, $x_{2,4}=10010$, $x_{2,5}=10001$, $x_{3,4}=11110$, $x_{3,5}=11101$, $x_{4,5}=11011$.

The Hamming ball B(c, 2) therefore contains $$\binom{5}{0} + \binom{5}{1} + \binom{5}{2} = 1 + 5 + 10 = 16$$

vectors.

FIG. 3 shows two representations 301, 302 of the Hamming ball 300 in $V_5$ with a radius of 2.

The first representation 301 shows a code word 303 which is surrounded by data words with a Hamming distance of 1 on a first ring 304 and data words with a Hamming distance of 2 on a second ring 305.

The second representation 302 is a simplified representation which is used below.

However, it should not be forgotten regarding the second representation 302 that a Hamming ball is not a continuous structure but rather a conglomeration of discrete points. (Since these are not points on the plane but rather an n-dimensional space, Hamming balls are also generally not round. The first representation 301 is therefore likewise a simplification.)

The Hamming ball B(c; r) with the center $c \in C \subseteq V_n$ and radius r in the case of a binary linear (n, k, d) code contains $$1 + \binom{n}{1} + \binom{n}{2} + \ldots + \binom{n}{r}$$

vectors of the vector space $V_n$.

In order to explain the error correction, let C be a linear (n, k, d) code and t an integer with the property d=2t+1, if d is odd, and d=2t+2, if d is even, that is to say t is the greatest integer with t<d/2.

Example: t=4 for d=9. t=3 for d=8. t=4 for d=10.

Let c be a code word. The Hamming ball B(c; t) contains $$1 + \binom{n}{1} + \binom{n}{2} + \ldots + \binom{n}{t} = \sum_{j=0}^{t} \binom{n}{j}$$

vectors, including the code word c which constitutes the center of the Hamming ball. Each vector (that is to say each received message word) which lies in the ball is reset to c by the decoding. That is to say, for all y∈B(c, t), the error correction is carried out by y|→c. The (n, k, d) code considered has the dimension k. That is to say, there are $2^k$ code words. Therefore, there are $2^k$ different (non-overlapping) Hamming balls (a respective code word is situated at their center).

The vectors in these $2^k$ Hamming balls are precisely the correctable message vectors. There are therefore $$2^k \sum_{j=0}^{t} \binom{n}{j}$$

correctable message vectors in the space of all possible message vectors which includes $2^n$ vectors. The relative proportion of correctable vectors is therefore given by $$\frac{2^k \sum_{j=0}^{t} \binom{n}{j}}{2^n} = 2^{k-n} \sum_{j=0}^{t} \binom{n}{j}$$

Example: t=7 for the (31, 5, 16) simplex code. There are $2^{31}$ possible message vectors. The number of correctable message vectors is therefore $$2^{5-31} \sum_{j=0}^{7} \binom{31}{j} = 0.053,$$

that is to say only 5.3% of all messages can be corrected according to the above procedure.

In contrast to the above procedure which can be considered to be conventional decoding, super decoding is carried out according to one embodiment, as is described below and is illustrated in FIG. 4.

FIG. 4 shows a comparison of 15 Hamming balls 401 with 15 super Hamming balls 402.

A message vector which can be decoded according to the above procedure is referred to as conventionally decodable below, that is to say a vector y is conventionally decodable if there is a code word c∈C with d(y, c)≤t.

Accordingly, a message vector which is within a Hamming ball 401 is conventionally decodable (that is to say correctable): decodable means that the message vector is replaced with the code word in the center of the ball during decoding. Points outside the balls 401 are not conventionally correctable.

For the simplex code, simple coding and decoding electric circuits, for example, can be used for the conventional error correction, that is to say the correction of errors which are within a ball of radius d/2 around the code word, the parameter d denoting the minimum distance of the code. Only moderate error rates can therefore be handled.

In contrast to this, a vector y is referred to as super decodable if it gives a uniquely determined code word c∈C with d(y, c)=d(y, C), that is to say y is super decodable if it gives a unique c∈C with d(y, c)<d(y, c') for all c'∈C with c'≠c. The super Hamming balls 402 represent the corresponding areas within which vectors are super decodable.

Accordingly, one embodiment provides a circuit which, in addition to the messages inside the Hamming balls 401, can also correct numerous messages which are already outside the Hamming ball (but inside the corresponding super Hamming ball), to be precise all messages which are at a shorter distance from the code word constituting the center of the ball than from all other code words. These messages are likewise mapped to the center of the ball by the electric circuit. For distinction from a conventional decoder (that is to say a decoder which carries out conventional error correction), such a decoder is referred to as a super decoder. In the case of the (31, 5, 16) simplex code, approximately 5.3% of all possible messages can be decoded using a conventional decoder, for example. Approximately 30% of all possible messages can be decoded using the super decoder.

As an example of use, the (7, 3, 4) simplex code is first of all considered below. This code can be implemented using the primitive polynomial $f(x)=x^3+x+1$.

The linear recursion formula $u_{n+3}=u_{n+1}+u_n$ for n≥0 is associated with the primitive polynomial f(x).

The first three sequence elements $u_0$, $u_1$, $u_2$ can be freely selected from the binary number field $F_2=11$. There are $2^3=8$ possibilities for selecting the initial values ($u_0$, $u_1$, $u_2$). With the aid of the linear recursion, the next four sequence elements $u_3$, $u_4$, $u_5$, $u_6$ are calculated for each initial value ($u_0$, $u_1$, $u_2$) (with the result that there is a total of $7=2^3-1$ sequence elements). The vector with the length of 7 given by ($u_0$, $u_1$, $u_2$, $u_3$, $u_4$, $u_5$, $u_6$) is then a code word of the (7, 3, 4) simplex code. All eight code words can be determined in this manner:

$c_0$=0000000;
$c_1$=1001011;
$c_2$=0101110;
$c_3$=0010111;
$c_4$=1100101;
$c_5$=1011100;
$c_6$=0111001;
$c_7$=1110010.

A 4×7 control matrix H of the simplex code is given by $$H = \begin{pmatrix} 1 & 0 & 0 & 0 & 1 & 1 & 0 \\ 0 & 1 & 0 & 0 & 0 & 1 & 1 \\ 0 & 0 & 1 & 0 & 1 & 1 & 1 \\ 0 & 0 & 0 & 1 & 1 & 0 & 1 \end{pmatrix}.$$

The first four columns of the matrix H form the 4×4 unit matrix. The last three columns of the matrix H are the end sections of the code words $c_1$, $c_2$, $c_3$ having a length of four bits, that is to say the last three columns of the matrix H can be generated by extending each of the three unit vectors (1, 0, 0), (0, 1, 0), (0, 0, 1) with the aid of the above linear recursion.

The control matrix H has the property: $Hc^T=0$ precisely when c is a code word.

If $y=(y_0, y_1, y_2, y_3, y_4, y_5, y_6)$ is any desired (binary) row vector with a length of seven bits, the column vector having a length of four bits is $$s = \begin{pmatrix} s_0 \\ s_1 \\ s_2 \\ s_3 \end{pmatrix}$$

given by $s=S(y)=Hy^T$, the syndrome of y.

The following is therefore true: the syndrome of a code word is always zero; and the syndrome of a non-code word is always not equal to zero.

For reasons of a simpler representation, column vectors are represented horizontally below, that is to say a distinction is not made between column vectors and row vectors below. For example, for $y=(1, 1, 0, 0, 0, 0, 1)$, the syndrome $s=S(y)$ is the column vector $$s = \begin{pmatrix} 1 \\ 0 \\ 1 \\ 1 \end{pmatrix}$$

which is, however, written as $s=S(y)=(1, 0, 1, 1)$ below.

The syndrome calculation for the simplex code is explained below.

Each linear (n, k, d) code has an (n−k)×n control matrix H (that is to say the matrix contains n−k rows and n columns). Let y be a row vector of the length n. The syndrome of y is then defined by a matrix vector multiplication: $S(y)=Hy^T$.

The control matrix H is not uniquely determined. A plurality of different control matrices may describe the same linear code (in the sense that a vector c is a code word precisely when $Hc^T=0$).

However, for each linear code, it is possible to select the control matrix H in such a manner that it has the form $H=(I_{n-k}, A)$, where $I_{n-k}$ is the (n−k)×(n−k) unit matrix. For the (7, 3, 4) simplex code considered here, precisely this form is selected for the control matrix H below:

$$H = \begin{pmatrix} 1 & 0 & 0 & 0 & 1 & 1 & 0 \\ 0 & 1 & 0 & 0 & 0 & 1 & 1 \\ 0 & 0 & 1 & 0 & 1 & 1 & 1 \\ 0 & 0 & 0 & 1 & 1 & 0 & 1 \end{pmatrix}$$

Let $y=(y_0, y_1, y_2, y_3, y_4, y_5, y_6)$. Then $$S(y) = Hy^T = \begin{pmatrix} y_0 + y_4 + y_5 \\ y_1 + y_5 + y_6 \\ y_2 + y_4 + y_5 + y_6 \\ y_3 + y_4 + y_6 \end{pmatrix}$$

or $S(y)=(y_0+y_4+y_5, y_1+y_5+y_6, y_2+y_4+y_5+y_6, y_3+y_4+y_6)$ if the syndrome is represented as a row vector.

For the simplex code, the syndrome can be calculated by means of a simple algorithm: let the row vector be $y=(y_0, y_1, \ldots y_{n-1})$ of the length n with $n=2^k-1$. Write the first $2^k-1-k$ sequence elements of y into a row. Calculate further $2^k-1-k$ sequence elements using the linear recursion formula associated with the polynomial f(x), in which case the last k coordinates of y, that is to say $y_{n-k}, \ldots, y_{n-2}, y_{n-1}$, are used as initial values (which are not assigned to the sequence, however). Then add the two rows (by bit-by-bit XOR). The result is the syndrome S(y).

For the simplex code considered here, the calculation is as follows: let $y=(y_0, y_1, y_2, y_3, y_4, y_5, y_6)$. The first row is: $y_0$, $y_1$, $y_2$, $y_3$. The linear recursion $y_{n+3}=y_{n+1}+y_n$ with the initial values $(y_4, y_5, y_6)$ provides the second row: $y_4+y_5$, $y_5+y_6$, $y_4+y_5+y_6$, $y_4+y_6$. The bit-by-bit addition of the two rows finally provides the syndrome: $y_0+y_4+y_5$, $y_1+y_5+y_6$, $y_2+y_4+y_5+y_6$, $y_3+y_4+y_6$.

Figure 5:
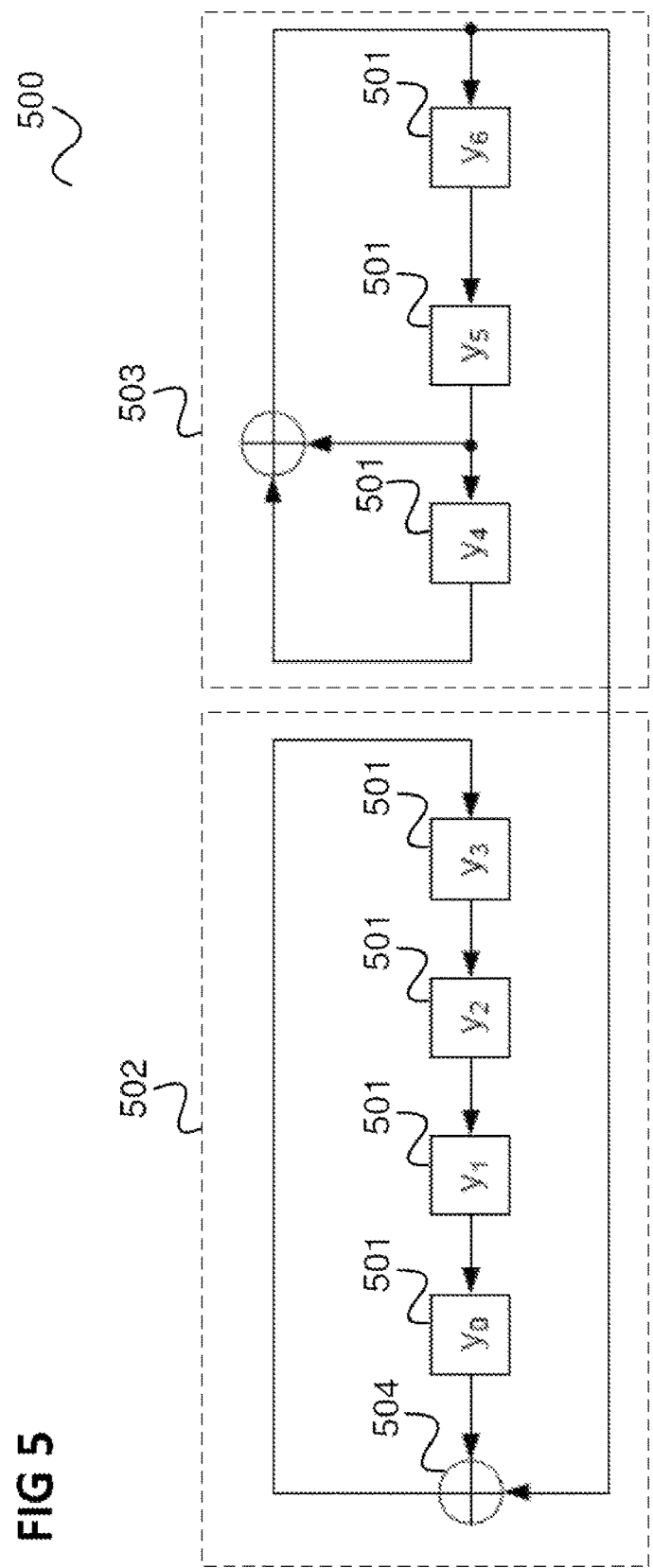
FIG. 5 shows a syndrome calculation circuit.

The syndrome calculation can be carried out using the circuit illustrated in FIG. 5, for example.

FIG. 5 shows a syndrome calculation circuit 500.

The circuit 500 has a total of $7=2^3-1$ flip-flops 501 (generally $2^k-1$ flip-flops for the $(2^k-1, k, 2^{k-1})$ simplex code). Initialization is effected with the row vector y, as indicated in the flip-flops 501. The flip-flops 501 are arranged in a left-hand electric circuit 502 and a right-hand electric circuit. The left-hand electric circuit 502 of the circuit 500 is a circulating shift register of the length $4=2^3-1-3$ (generally of the length $2^k-1-k$). The right-hand electric circuit 503 of the circuit is an LFSR (linear feedback shift register) according to a characteristic polynomial f(x) of the length 3 (generally the length k=deg(f), that is to say the degree of the polynomial f).

The contents of the right-hand electric circuit 503 can be added bit-by-bit to the contents of the left-hand electric circuit 502 by an adder 504.

After $4=2^3-1-3$ (generally $2^k-1-k$) cycles, the register on the left-hand side (that is to say the flip-flops 501 in the left-hand electric circuit 502) contains the entries $y_0+y_4+y_5$, $y_1+y_5+y_6$, $y_2+y_4+y_5+y_6$, $y_3+y_4+y_6$ which represent the four coordinates of the syndrome (generally the $2^k-1-k$ coordinates).

Figure 6:
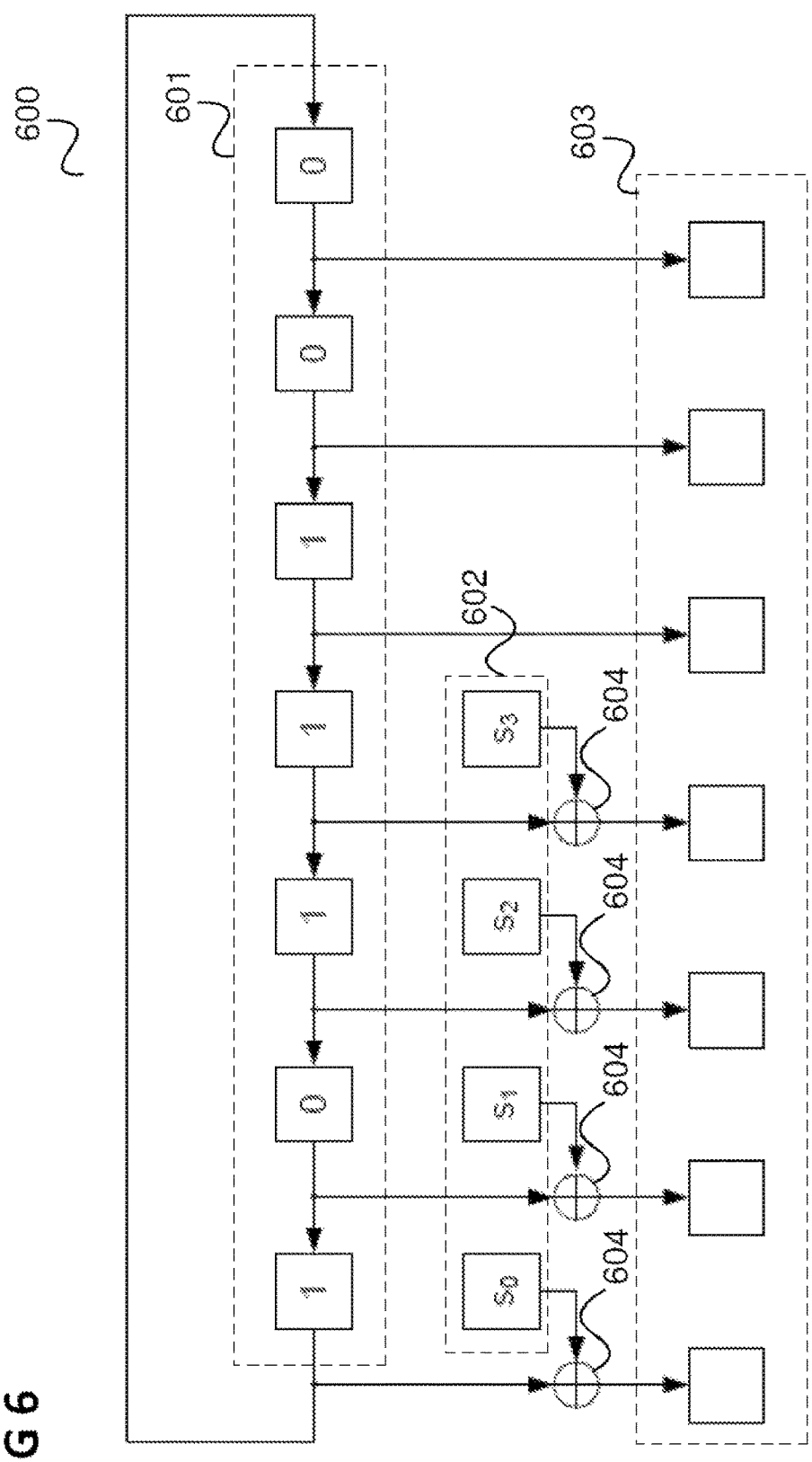
FIG. 6 shows an example of a decoder for the simplex code.

FIG. 6 shows an example of a decoder 600 for the simplex code.

The decoder 600 has three registers 601, 602, 603. The upper register 601 is a circulating shift register of the length $2^3-1=7$ (generally of the length $2^k-1$) with a permanently impressed initial state.

The initial assignment corresponds to a code word of the simplex code, here the code word c5. The middle register 602 has the length $2^3-1-3=4$. It contains the syndrome $s=S(y)$ of the message vector y to be corrected. The middle register 602 can therefore be written to, such that the previously calculated syndrome s can be read into the register. (The syndrome s can be calculated using the electric circuit illustrated in FIG. 5, for example.)

The lower register 603 has the length 7. The error vector e is present in this register at the end of the execution of the error detection algorithm. For the lower register 603, the number of ones (in the seven cells) can be counted, that is to say the Hamming weight w=w(v) of the current seven-bit vector v stored in the lower register 603 can be determined. The lower register 603 can also be reset. All register contents are deleted during resetting. The contents of the lower register 603 may be read out.

The left-hand four bits of the contents of the first register 601 can be combined with the contents of the second register 602 by addition 604.

The algorithm for detecting and correcting errors according to one embodiment is described below.

With regard to the ability to correct errors, it should be borne in mind that the minimum distance for the (7, 3, 4) simplex code considered is d=4. Therefore, any one-bit error can be corrected (since 1<d/2=2). The super decodability does not come into effect in this example.

The decoder 600 operates according to the following algorithm, for example.

Let y be the received (potentially erroneous) message.

1. Calculate the syndrome s=S(y). If s=0, y is considered to be error-free. End.

2. Let s≠0. Calculate the Hamming weight w=w(s). If w<d/2=2, precisely k=3 zeros are appended to the vector s. The syndrome extended in this manner is the error vector e. c=y+e is the corrected message. End.

3. Let w(s)≥d/2=2. Read the syndrome s into the middle register 602. Combine the contents of the upper register 601 and of the middle register 602 by the adders 604. In this case, the first (that is to say left-hand) four bits of the upper register 601 are added bit-by-bit to the contents of the middle register 602 and the last (right-hand) three bits of the upper register 601 are transferred without change into the lower register 603. The result of this addition is denoted $E_0$. The 7-bit vector $E_0$ is in the lower register 603. Determine $w(E_0)$, the Hamming weight of the vector $E_0$. If $w(E_0)$<d/2, set e=$E_0$. The vector e is the error vector sought. End.

4. Let $w(E_0)$≥d/2. Clock the upper register 601 once, that is to say the contents of the upper register 601 are shifted cyclically to the left by one position. Combine the (shifted) contents of the upper register 601 with the unchanged contents of the middle register 602, like in 3. A new vector $w(E_1)$ is obtained in the lower register 603 as a result. Calculate $w(E_1)$. If $w(E_1)$<d/2, set e=$E_1$. End. Otherwise, repeat 4. until a vector $E_j$ with $w(E_j)$<d/2 occurs in the lower register 603. This is the error vector e=$E_j$. End.

5. The upper register 601 can be clocked seven times and it is then in its initial state again. If a vector $E_j$ with a Hamming weight of less than d/2 is never produced in the lower register 603 during these seven attempts, y cannot be corrected. End.

Example: the received message is y=1110101. Calculate the syndrome: s=S(y)=0010. Calculate the Hamming weight: w(s)=1<d/2=2. The error vector is e=(s; 000)=0010000. The corrected message is therefore c=y+e=1100101.

Example: the received message is y=0111011. s=1110, w(s)=3. $E_0$=0101100, $w(E_0)$=3, repeat. $E_1$=1001001, $w(E_1)$=3, repeat. $E_2$=0000010, $W(E_2)$=1<d/2, end. The error vector is e=E2=0000010. The corrected message c is given by c=y+e=0111001.

The decoder 600 can be extended as follows to form a PUF decoder.

Let a be the true PUF value. Let the auxiliary information relating to a be denoted b, where b is the syndrome of a: b=S(a)=$Ha^T$.

Let a' be the current available PUF value. The aim is to reconstruct the true PUF value a from a' and b.

For this purpose, the decoder 600 can be used with the following adaptations:

Let a' be the current (potentially erroneous) PUF value and let b be the stored auxiliary information associated with the true PUF value a.

1'. Calculate the syndrome s'=S(a'). Calculate s=s'+b. If s=0, a' is considered to be error-free. Set a=a'. End. All other steps of the algorithm described above for the decoder 600 remain the same. The error vector e is obtained in the lower register 603 at the end of the algorithm. The true PUF value a is then given by a=a'+e.

Example 1: let the current PUF value a'=1010011 and let the auxiliary information be b=1000. The syndrome s' of a' is s'=S(a')=$Ha'^T$=0011.

Then, s=s'+b=1011 is calculated. The Hamming weight is w(s)=3, and so step 3. is carried out. This provides $E_0$=0000100. Since $w(E_0)$=1<d/2, $E_0$ is already the error vector sought: e=$E_0$=0000100. The true PUF value a is a=a'+e=1010111.

Figure 7:
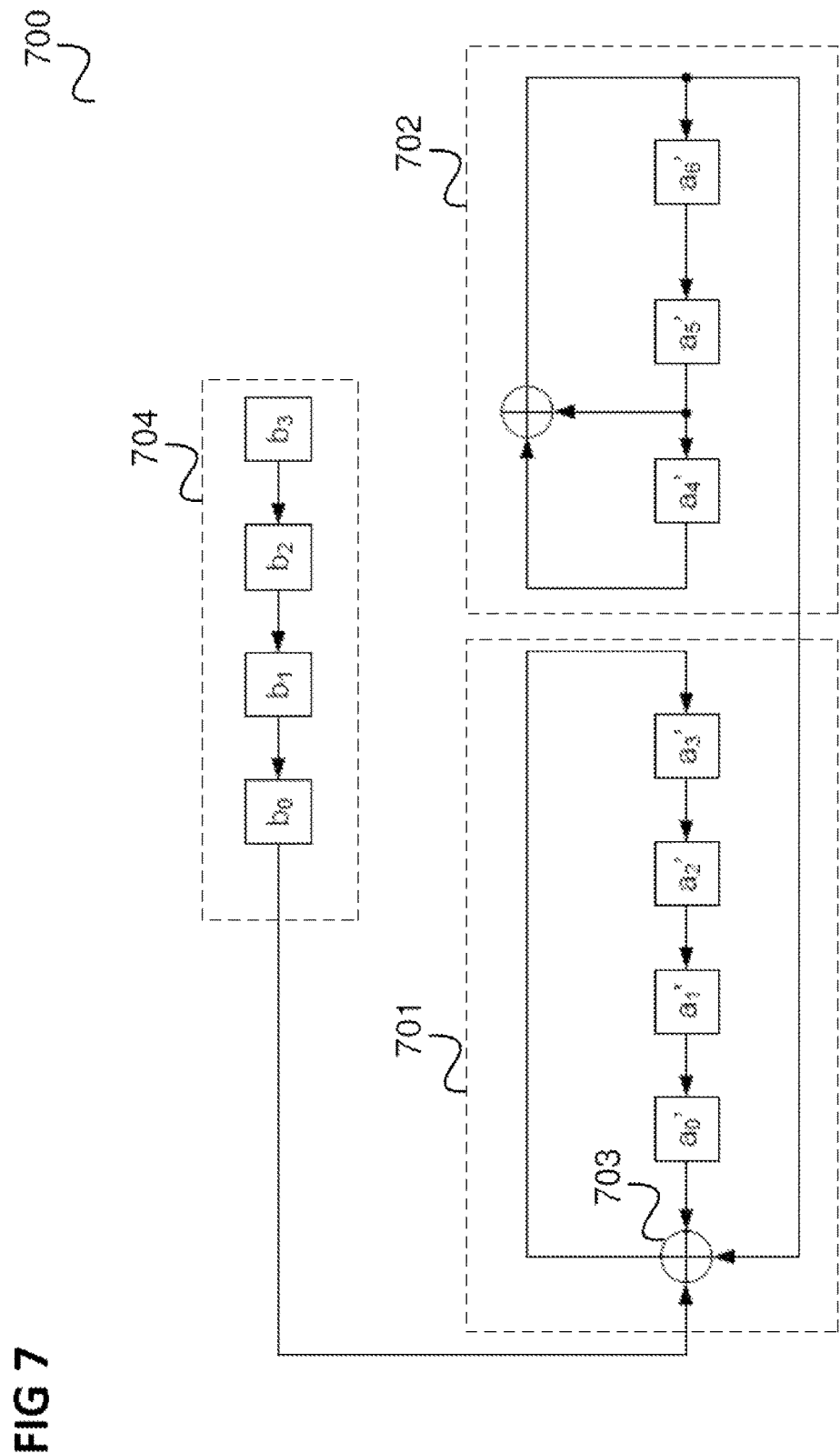
FIG. 7 shows a circuit for calculating a syndrome for PUF reconstruction.

The vector s can be calculated directly using the circuit shown in FIG. 7.

FIG. 7 shows a circuit 700 for calculating a syndrome for PUF reconstruction.

The use of the circuit 700 can be implemented more efficiently than multiplying by the control matrix H.

The circuit 700 has a left-hand electric circuit 701 and a right-hand electric circuit 702 corresponding to the electric circuits 502, 503 of the circuit 500. Only the adder 703 in the left-hand electric circuit 701 has an additional input via which the auxiliary information stored in a register 704 can be supplied to the left-hand electric circuit 702 (that is to say pushed into the left-hand electric circuit 702 bit-by-bit).

The circuit 700 is initialized with the vector a', as illustrated. FIG. 7 shows the state of the circuit 700 at the time t=0, that is to say immediately after initialization. After four cycles, that is to say at the time t=4, the register in the left-hand electric circuit 701 contains the required vector s.

As a further example, the (15, 4, 8) simplex code is considered.

The primitive polynomial f(x)=$x^4$+x+1 can be used to construct the (15, 4, 8) simplex code. This code consists of $2^4$=16 code words each having a length of 15 bits.

The code has the minimum distance d=8. All 1-bit, 2-bit and 3-bit errors can be conventionally corrected (according to the above definition). In addition, 31% of all 4-bit errors can be corrected according to super decoding.

The 11×15 matrix $$H = \begin{pmatrix} 1 & 0 & 0 & 0 & 0 & 0 & 0 & 0 & 0 & 0 & 0 & 1 & 1 & 0 & 0 \\ 0 & 1 & 0 & 0 & 0 & 0 & 0 & 0 & 0 & 0 & 0 & 0 & 1 & 1 & 0 \\ 0 & 0 & 1 & 0 & 0 & 0 & 0 & 0 & 0 & 0 & 0 & 0 & 0 & 1 & 1 \\ 0 & 0 & 0 & 1 & 0 & 0 & 0 & 0 & 0 & 0 & 0 & 1 & 1 & 0 & 1 \\ 0 & 0 & 0 & 0 & 1 & 0 & 0 & 0 & 0 & 0 & 0 & 1 & 0 & 1 & 0 \\ 0 & 0 & 0 & 0 & 0 & 1 & 0 & 0 & 0 & 0 & 0 & 0 & 1 & 0 & 1 \\ 0 & 0 & 0 & 0 & 0 & 0 & 1 & 0 & 0 & 0 & 0 & 1 & 1 & 1 & 0 \\ 0 & 0 & 0 & 0 & 0 & 0 & 0 & 1 & 0 & 0 & 0 & 0 & 1 & 1 & 1 \\ 0 & 0 & 0 & 0 & 0 & 0 & 0 & 0 & 1 & 0 & 0 & 1 & 1 & 1 & 1 \\ 0 & 0 & 0 & 0 & 0 & 0 & 0 & 0 & 0 & 1 & 0 & 1 & 0 & 1 & 1 \\ 0 & 0 & 0 & 0 & 0 & 0 & 0 & 0 & 0 & 0 & 1 & 1 & 0 & 0 & 1 \end{pmatrix}$$

is a control matrix for this code. The syndrome S(y) for a 15-bit vector y is calculated with the aid of the matrix H: S(y)=$Hy^T$.

The first n−k=15−4=11 columns of the matrix H form the 11×11 unit matrix $I_{11}$. The last k=4 columns of the matrix H can be generated using the recursion formula (associated with $f(x)=x^4+x+1$) $u_{n+4}=u_{n+1}+u_n$ and the initial values (1, 0, 0, 0), (0, 1, 0, 0), (0, 0, 1, 0), (0, 0, 0, 1). For example, the recursion formula with the initial vector (0, 0, 0, 1), that is to say with $u_0=u_1=u_2=0$ and $u_3=1$, produces the sequence elements $u_4=0$, $u_5=0$, $u_6=1$, $u_7=1$, $u_8=0$, $u_9=1$, $u_{10}=0$, $u_{11}=1$, $u_{12}=1$, $u_{13}=1$ and $u_{14}=1$, that is to say the last column of the matrix H.

Figure 8:
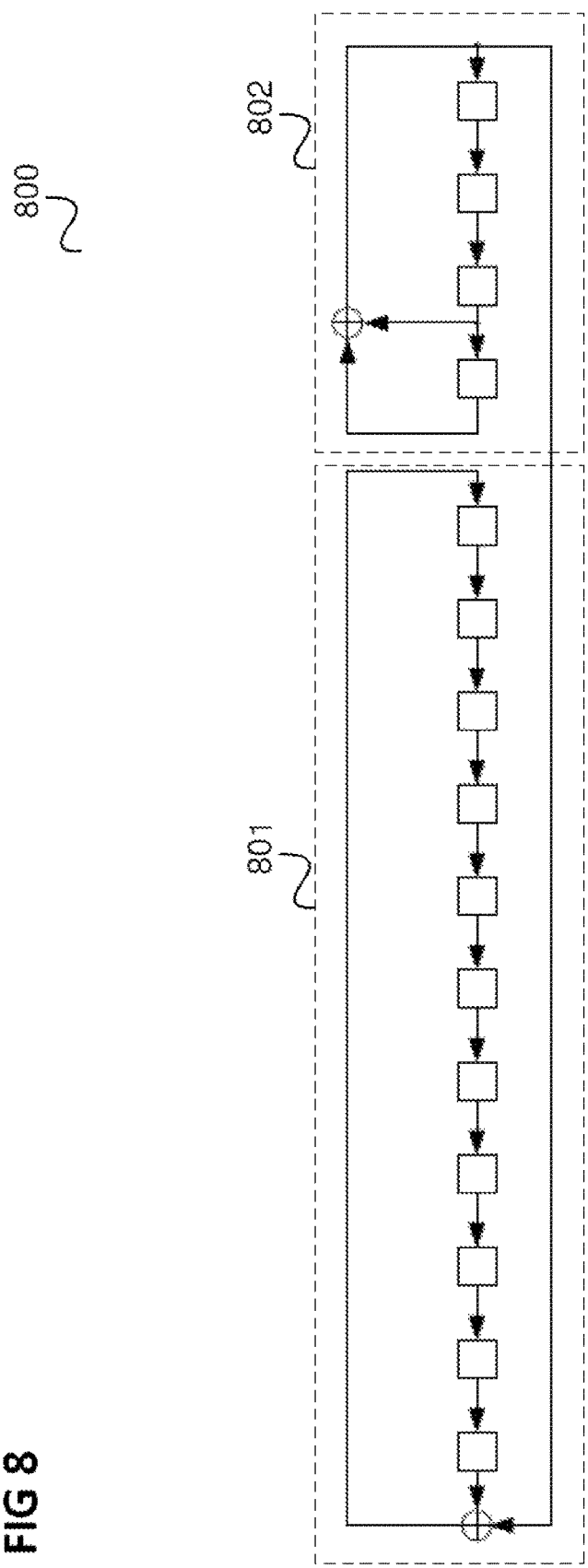
FIG. 8 shows a syndrome calculation circuit.

Instead of carrying out the matrix multiplication or implementing it in hardware, the syndrome can be calculated using the circuit shown in FIG. 8.

FIG. 8 shows a syndrome calculation circuit 800.

In a similar manner to the circuit 500, the circuit 800 has a left-hand electric circuit 801 and a right-hand electric circuit 802 which correspond to the left-hand electric circuit 501 and the right-hand electric circuit 502 apart from the adaptation of the respective register lengths to the code used in this example.

It is assumed that $y=(y_0, y_1, \ldots, y_{14})$ is the received message. S(y), the syndrome of y, is sought. The circuit 800 is then initialized with the vector y. The first 11 components $y_0, y_1, \ldots, y_{10}$ are stored in the left-hand electric circuit 801, that is to say the left-hand circulating shift register. The last four coordinates $y_{11}, y_{12}, y_{13}, y_{14}$ are stored in the right-hand electric circuit 802, that is to say the linear feedback shift register.

The electric circuit 800 is then clocked 11 times. The 11-bit syndrome is then situated in the register in the left-hand electric circuit 801. The contents of the four-bit register in the right-hand electric circuit 802 can be ignored.

Figure 9:
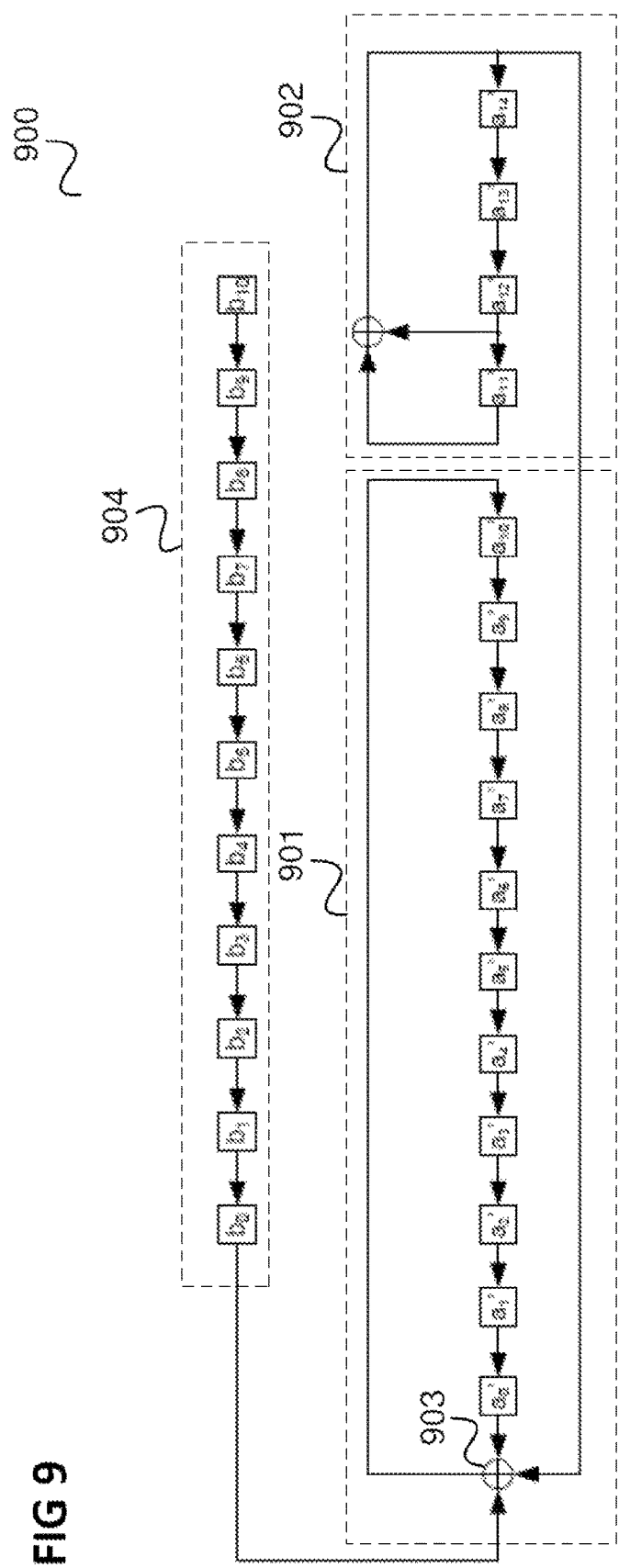
FIG. 9 shows a syndrome calculation circuit for PUF reconstruction.

FIG. 9 shows a syndrome calculation circuit 900 for PUF reconstruction.

The circuit 900 has a left-hand electric circuit 901 and a right-hand electric circuit 902 corresponding to the electric circuits 801, 802 of the circuit 800. Only the adder 903 in the left-hand electric circuit 901 has an additional input via which the auxiliary information stored in a register 904 can be supplied to the left-hand electric circuit 902 (that is to say pushed into the left-hand electric circuit 902 bit-by-bit).

An 11-bit auxiliary vector b is calculated and stored for the original, the so-called true, PUF value a (which is a 15-bit row vector). This auxiliary vector b is precisely the syndrome of a. That is to say b=S(a). The auxiliary vector b is kept available in order to be able to reconstruct the true PUF value a in the sequence. (The true PUF value a is not stored for security reasons, for example.)

For a new PUF request, the PUF provides a current 15-bit vector a'. The vector a' is generally an erroneous version of the true PUF value a. The true PUF value a is reconstructed from a' and b.

In this case, it is necessary to calculate an 11-bit vector $s=(s_0, s_1, \ldots, s_{10})$. The vector s is calculated by s=S(a')+b.

It is possible to calculate s using the circuit 900. The left-hand electric circuit 901 and the right-hand electric circuit 902 (shift registers) are initialized with the accrued PUF vector a'. The auxiliary vector b is kept available in the register 904.

The electric circuit 900 is clocked 11 times. The vector s sought is then situated in the 11-bit shift register in the left-hand electric circuit 901. The contents of the linear feedback shift register in the right-hand electric circuit can be ignored. The data in the register 904 have been completely pushed out.

Alternatively, the register 904 which contains the auxiliary vector b may be in the form of a circulating 11-bit shift register. If this register were initialized with the auxiliary vector b, it would not be empty after 11 cycles but rather would again contain the auxiliary vector b.

Figure 10:
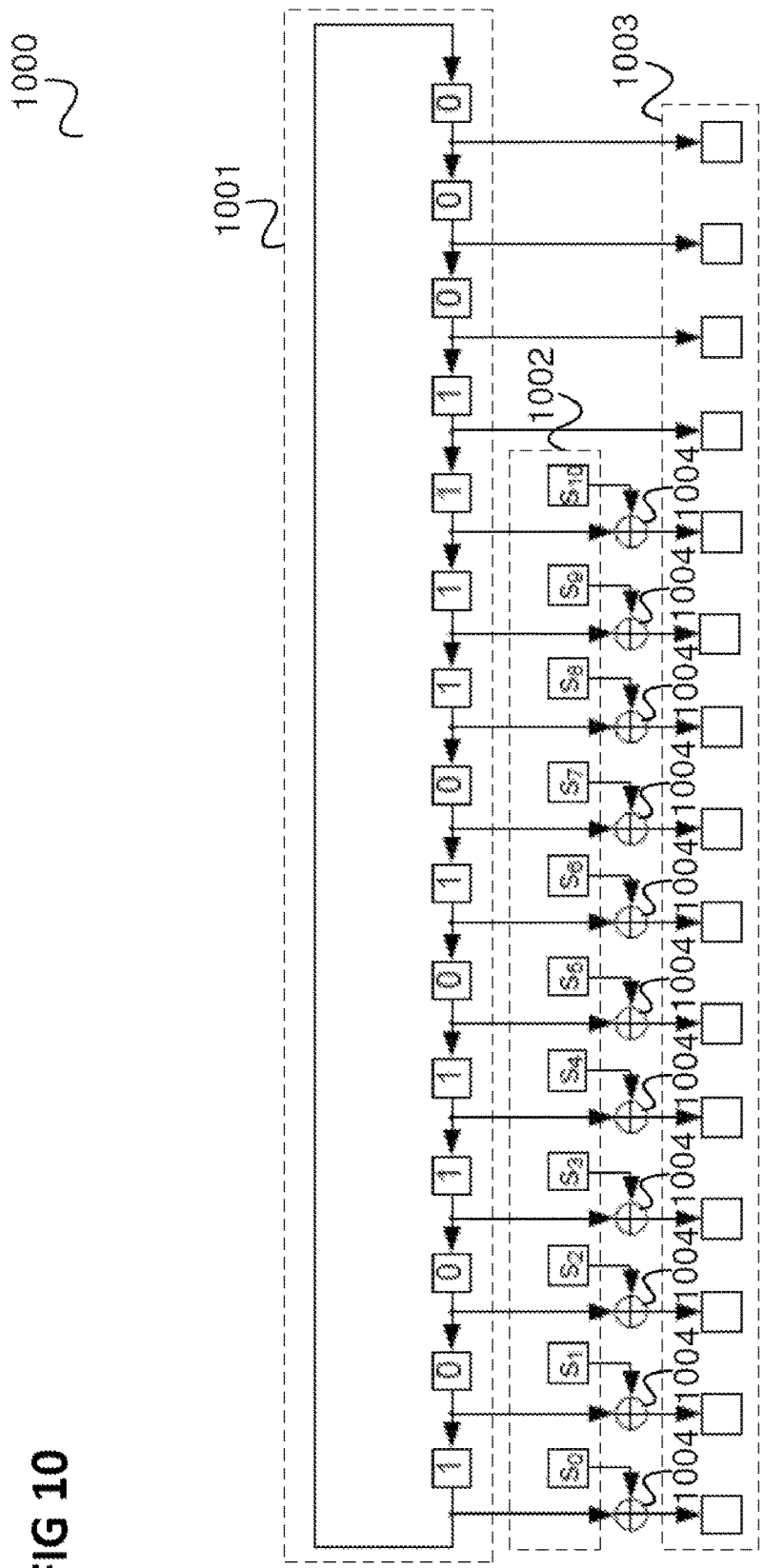
FIG. 10 shows a decoder for PUF reconstruction for the (15, 4, 8) simplex code.

FIG. 10 shows a decoder 1000 for PUF reconstruction for the (15, 4, 8) simplex code.

In a similar manner to the decoder 600, the decoder has three registers 1001, 1002, 1003 and adders 1004, the length and number of which are adapted to the code used in this example.

Example (PUF reconstruction):
a'=110111010011111;
b=11101011011;
s'=11001110011=S(a');
s=00100101000=s'+b.

The Hamming weight is w(s)=3<d/2=4. The vector s extended by k=4 zeros therefore already results in the error vector sought: e=(s, 0000)=001001010000000.

The true PUF value a is a=a'+e=111110000011111.

Example (PUF reconstruction):
a'=011101001101111;
b=11110001000;
s'=01100111100=S(a');
s=10010110100=s'+b.

The Hamming weight is w(s)=5≥d/2=4. The decoder 100 is used to calculate the vectors $E_0, E_1, \ldots$
$E_0$=000011000111000; w(E0)=5≥d/2, next
$E_1$=101000110110001; w(E1)=7≥d/2, next
$E_2$=111111010100010; w(E2)=9≥d/2, next
$E_3$=010000010000100; w(E3)=3<d=2, end.

The error vector is e=E3. The true PUF value a is equal to a=a'+e=001101011101011.

In the preceding examples, messages were corrected or PUF values were reconstructed in which fewer than d/2 errors occurred.

If d/2 or more errors occur, correction is likewise possible in some cases. For this purpose, the decoder 600 according to one embodiment is used for super decoding as follows. The procedure is described for the general $n=2^k-1$, k, $d=2^{k-1}$ simplex code.

The weight w(s) of the syndrome is greater than d/2 in the case of super decoding. 1 to 4 in the algorithm described above in connection with the decoder 600 are therefore carried out as described above. In 3 and 4 of the algorithm, the vectors $E_0, E_1, \ldots, E_{n-1}$ with $n=2^k-1$ are calculated in order. The Hamming weight is now determined for each of these vectors and the Hamming weights are stored. Let wj=w(Ej) for j=0, 1, . . . , n−1. The smallest number m from the set $\{w_0, w_1, \ldots, w_{n-1}; w(s)\}$ is then determined. If the minimum m of the set occurs only once among the $2^k$ elements in the set, the message vector y or the PUF value a' can be corrected.

Assuming that $m=w_j$ for the minimum m for a uniquely determined j∈{0, 1, . . . , n−1}, the error vector sought is $e=E_j$. If the uniquely determined minimum m of the set is identical to w(s), the error vector is e=(s; 0 0 . . . 0), in which case k zeros are appended to s.

Example (PUF reconstruction):
a'=001000010010000;
b=01000101110;
s'=00100001001=S(a');
s=01100100111=s'+b.

The Hamming weight is w(s)=6≥d/2=4. The decoder (with the dimensioning according to FIG. 10 in this example) calculates the vectors $E_0, E_1, \ldots, E_{14}$.
$E_0$=111111100001000;
$E_1$=010100010000001;

$E_2$=000011110010010;

. . .

$E_{14}$=001010011001100.

The Hamming weight is determined and stored for each vector. (The vectors Ej themselves must not be stored.) The weights of $E_j$ are $w_0$=8; $w_1$=4; $w_2$=6; $w_3$=8; $w_4$=10;
$w_5$=8; $w_6$=8; $w_7$=8; $w_8$=8; $w_9$=6;
$w_{10}$=6; $w_{11}$=10; $w_{12}$=12; $w_{13}$=6; $w_{14}$=6.

The value w(s)=6 is also added to these 15 Hamming weights. The minimum from the set of these 16 Hamming weights is 4 and the minimum occurs a single time, namely w1=4. Therefore, the error vector sought is e=$E_1$=010100010000001.

The true PUF value a is therefore given by a=a'+e=011100000010001.

Example (PUF reconstruction):

a'=011000011101100;
b=10001000001;
s'=00101100101=S(a');
s=10100100100=s'+b.
w(s)=4≥d/2.

The 15 vectors $E_0$, $E_1$, . . . , $E_{14}$ are calculated and their Hamming weights are determined.

The minimum m is then determined as follows: m=min($w_0$; $w_1$; $w_2$; . . . ; $w_{13}$; $w_{14}$; w(s))=min(8; 6; 8; 6; 6; 10; 6; 8; 8; 8; 6; 8; 12; 6; 10; 4)=4.

The minimum m=4 is assumed only once, namely for w(s)=4. Therefore, the error vector e is given by e=(s; 0000)=101001001000000.

The true PUF value a is a=a'+e=110001010101100.

Example (PUF reconstruction):
a'=000010001111111;
b=11111011100;
s'=00011011101=S(a');
s=11100000001=s'+b;
w(s)=4≥d/2.

The vectors $E_0$, $E_1$, . . . , $E_{14}$ are again calculated and their Hamming weights $w_0$, $w_1$, . . . , $w_{14}$ are stored.

m=min($w_0$; $w_1$; $w_2$; . . . ; $w_{13}$, $w_{14}$; w(s))=min(8; 8; 8; 8; 8; 8; 8; 8; 4; 4; 8; 8; 12; 8; 8; 4)=4;

where the minimum m=4 is assumed three times: $w_8$=4, $w_9$=4, w(s)=4.

The error vector e is not uniquely determined. Instead, there are three possible error vectors: $e_1$=$E_8$, $e_2$=$E_9$, $e_3$=(s, 0000).

Therefore, there are also three different candidates for the true PUF value a:

$a_1$=a'+$e_1$=a'+$E_8$=000110011110101;
$a_2$=a'+$e_2$=a'+$E_9$=000010101011010;
$a_3$=a'+$e_3$=a'+(s, 0)=111010001101111.

According to one embodiment, the vectors $E_0$, $E_1$, . . . , $E_{14}$ are not stored in order to avoid the necessary storage requirement (and corresponding costs). For example, $E_8$ can be calculated, however, from the information $w_8$=4: clock the decoder 1000 in FIG. 6 eight times, add s, and obtain $E_8$ in the lower register 1003. Since $w_9$=4, clock the upper register 1001 a further time, add s, and obtain E9.

$e_1$=$E_8$=000100010001010;
$e_2$=$E_9$=000000100100101;
$e_3$=(s; 0)=111000000010000.

The (31, 5, 16) simplex code is considered as a further example.

A primitive binary polynomial f(x) of the degree k=5 is used to construct the (31, 5, 16) simplex code. There are six such polynomials. The polynomial $f(x)=x^5+x^2+1$ is one of them. The simplex code considered consists of $2^k=2^5=32$ different code words. Each of these code words has a length of $2^k-1=2^5-1=31$ bits.

Let u=$u_0 u_1 u_2$ . . . $u_{29} u_{30}$ be a code word. The first k=5 coordinates $u_0$, $u_1$, $u_2$, $u_3$, $u_4$ are freely selectable. (There are $2^5$=32 possibilities for selecting these first five coordinates.) The remaining $2^k-1-k=2^5 1-5=26$ coordinates $u_5$, $u_6$, . . . , $u_{29}$, $u_{30}$ are calculated from the initial values $u_0$, $u_1$, $u_2$, $u_3$, $u_4$ with the aid of the recursion formula (associated with f(x)) $u_{j+5}=u_{j+2}$ for j=0, 1, . . . , 25. These 26 coordinates are therefore determined by the five initial values.

There are 32 different code words because there are 32 possibilities for the quintuple ($u_0$, $u_1$, $u_2$, $u_3$, $u_4$) of the initial values.

The minimum distance d of the (31, 5, 16) simplex code considered is d=16. Therefore, every t-bit error with t≤7 can be corrected using a conventional decoder. Accurate analysis shows that approximately 95% of all 8-bit errors, 67% of all 9-bit errors and 30% of all 10-bit errors can be uniquely corrected using a super decoder.

Assuming that a message word c=$c_0 c_1$ . . . $c_{30}$ has been sent and the message word y=$y_0 y_1$ . . . $y_{30}$ is received.

Certain bits are switched during transmission (that is to say they have changed their value from 0 to 1 or from 1 to 0). They are intended to be corrected. The syndrome S(y), which is a 26-bit vector in this example, is used for this purpose. The syndrome S(y) can be efficiently calculated using the circuit shown in FIG. 11.

Figure 11:
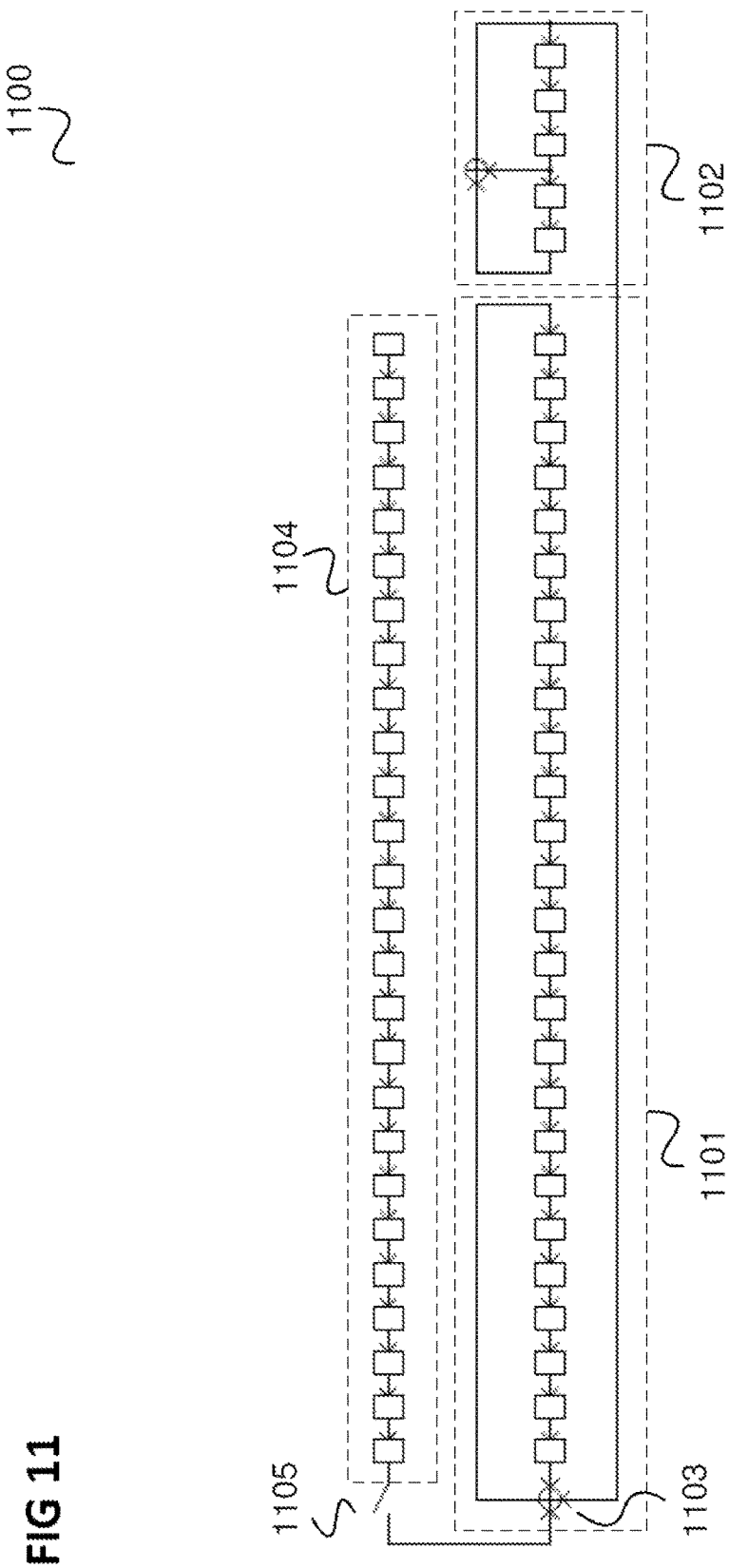
FIG. 11 shows a syndrome calculation circuit.

FIG. 11 shows a syndrome calculation circuit 1100.

In a similar manner to the circuit 900, the circuit 1100 has a left-hand electric circuit 1101 and a right-hand electric circuit 1102 and the adder 1103 in the left-hand electric circuit 1101 has an additional input via which auxiliary information stored in a register 1104 can be supplied to the left-hand electric circuit 1102 (that is to say pushed into the left-hand electric circuit 1102 bit-by-bit).

The register 1104 has a length of 26 bits and can be used to calculate the syndrome for PUF reconstruction. In this example, in which the word y is intended to be decoded, the register is not used and is decoupled, for example by opening a switch 1105.

The circuit 1100 is initialized with the 31 bits of y. The first 26 bits of y enter the left-hand shift register (that is to say the register in the left-hand electric circuit 1101) and the last five bits enter the right-hand shift register (that is to say the register in the right-hand electric circuit 1102). The right-hand register is a linear feedback shift register which implements the linear recursion $u_{j+5}=u_{j+2}+u_j$. After it has been initialized, the circuit 1100 is clocked $2^k-1-k=2^5-1-5$=26 times. The syndrome S(y) is then situated in the 26-bit left-hand register.

The Hamming weight of the syndrome is now determined. If the Hamming weight is less than d/2=16/2=8, k=5 zeros are appended to the syndrome. The 31-bit vector e formed in this manner is the error vector sought. The corrected message c is then given by c=y+e.

If the Hamming weight of the syndrome is greater than or equal to d/2=8, the syndrome is stored in the middle register 1002 of the (appropriately dimensioned) decoder 1000. The decoder 1000 then provides the error vector e using one of the algorithms described above.

The PUF reconstruction is closely related but is not identical to the problem of error correction during message transmission. During message transmission, the message to be transmitted is always a code word. In the case of the PUF topic, the original PUF value, the so-called true PUF value a, is fundamentally any desired n-bit vector (here n=31). The PUF value generation is independent of the use of the (31; 5; 16) simplex code for its correction.

After the PUF value has been generated for the first time, the auxiliary information b=S(a) is first of all calculated for the PUF reconstruction. Since the auxiliary information is the syndrome of a, the circuit 1100 can be used: initialize with a, clock 26 times. Take the auxiliary vector b from the left-hand register.

In order to describe the PUF reconstruction, let a' now be a newly read PUF value. The 31-bit vector a' is generally just as little a code word as a.

The syndrome of a' is first of all calculated and is added to the auxiliary vector b. The following is true S(a')+b=S(a')+S(a)=S(a'+a)=S(e), that is to say the syndrome of the error vector e can be determined in this manner. The connection to error correction is thereby established since, during error correction, a code word c is transmitted during message transmission, a potentially erroneous message word y=c+e is received and the syndrome of y is first of all calculated: S(y)=S(c+e)=S(c)+S(e)=0+S(e)=S(e).

The task of the decoding algorithm is to determine the error vector e from the syndrome S(e).

During PUF reconstruction, the 26-bit vector s=S(a')+b=S(e) is therefore first of all calculated from the current PUF value a' and the auxiliary vector b. The circuit 1100 can be used for this purpose: initialize the two lower registers, that is to say the register in the left-hand electric circuit 1101 and the register in the right-hand electric circuit 1102 with a', as described above, and initialize the upper register 1104 with b. Close the switch 1104 and clock the electric circuit 26 times. Then, s is situated in the left-hand register.

Example (PUF: calculation of the auxiliary vector b):
Let the true PUF value a be given by:
a=01001 00010 00011 10101 01010 10101 1

The auxiliary vector b is the syndrome of a, that is to say b=S(a). S(a) can be calculated by adding the following two 26-bit vectors bit-by-bit:

1. The first 26 bits of a, that is to say 01001 00010 00011 10101 01010 1.
2. The first 26 output bits of a linear feedback shift register according to the characteristic polynomial $f(x)=x^5+x^2+1$, where the last five bits of a are used to initialize the shift register, as illustrated in FIG. 12.

Figure 12:
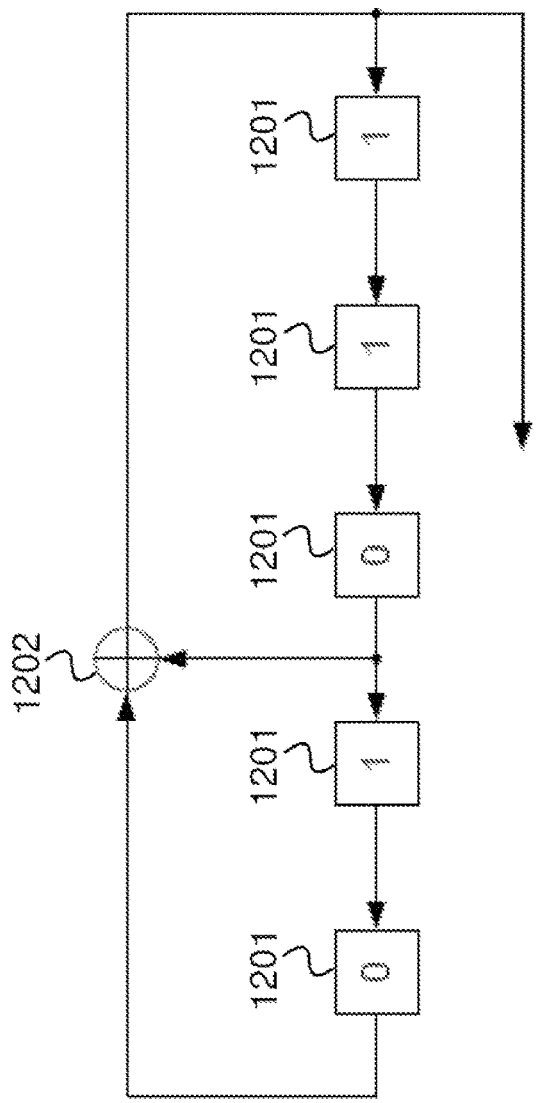
FIG. 12 shows a linear feedback shift register.

FIG. 12 shows a linear feedback shift register 1200.

The shift register 1200 has five flip-flops 1201 and an adder 1202 which adds the contents of the leftmost flip-flop and the middle flip-flop and outputs the result and supplies it to the rightmost flip-flop, with the result that the shift register 1200 implements the recursion formula $u_{n+5}=u_{n+2}+u_n$.

In this example, the shift register 1200 provides the vector 00111 11000 11011 10101 00001 0. The auxiliary vector b=01110 11010 11000 00000 01011 1 is the sum of these two vectors. This is illustrated in FIG. 13.

Figure 13:
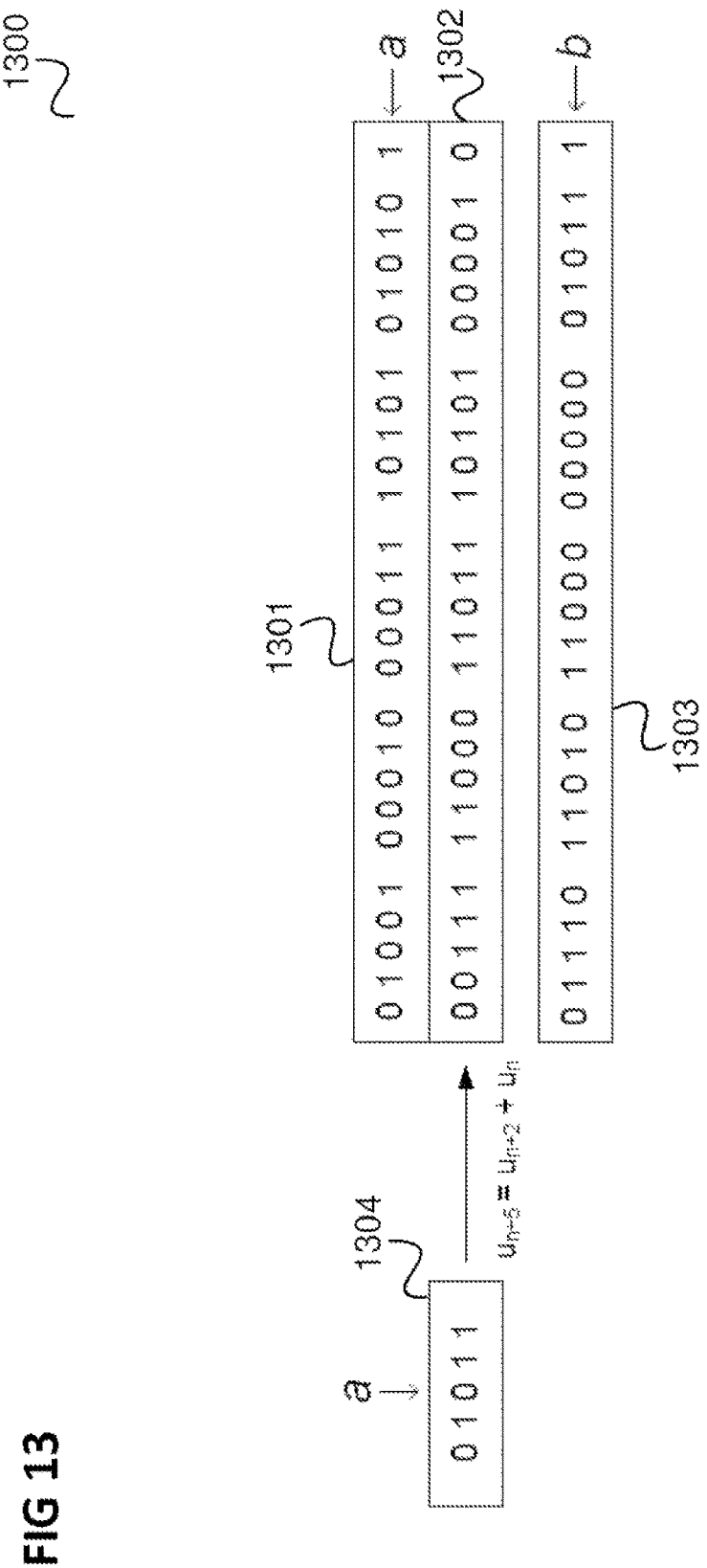
FIG. 13 shows the syndrome calculation for a vector.

FIG. 13 illustrates the syndrome calculation for the vector a.

The syndrome 1303, that is to say the vector b, is given by the sum of a first vector 1301, given by the first 26 bits of a, and a second vector 1302, which results from the right-hand five bits 1304 of a by using the recursion formula $u_{n+5}=u_{n+2}+u_n$.

Example (PUF reconstruction):
a'=01111 01010 00111 10111 01111000111;
b=01110 11010 11000 00000 01011 1.

Calculation of s'=S(a'): take the last five bits of a', that is to say 00111, as initial values. Calculate the next 26 sequence elements using the linear recursion $u_{j+5}=u_{j+2}+u_j$. Add the 26-bit vector, which consists of the first 26 elements of a', to this 26-bit vector. The sum vector is s'=10111 10001 10010 10110 01001 1.

Calculation of s: s=s'+b. Therefore, s=11001 01011 01010 10110 00001 0.

Figure 14:
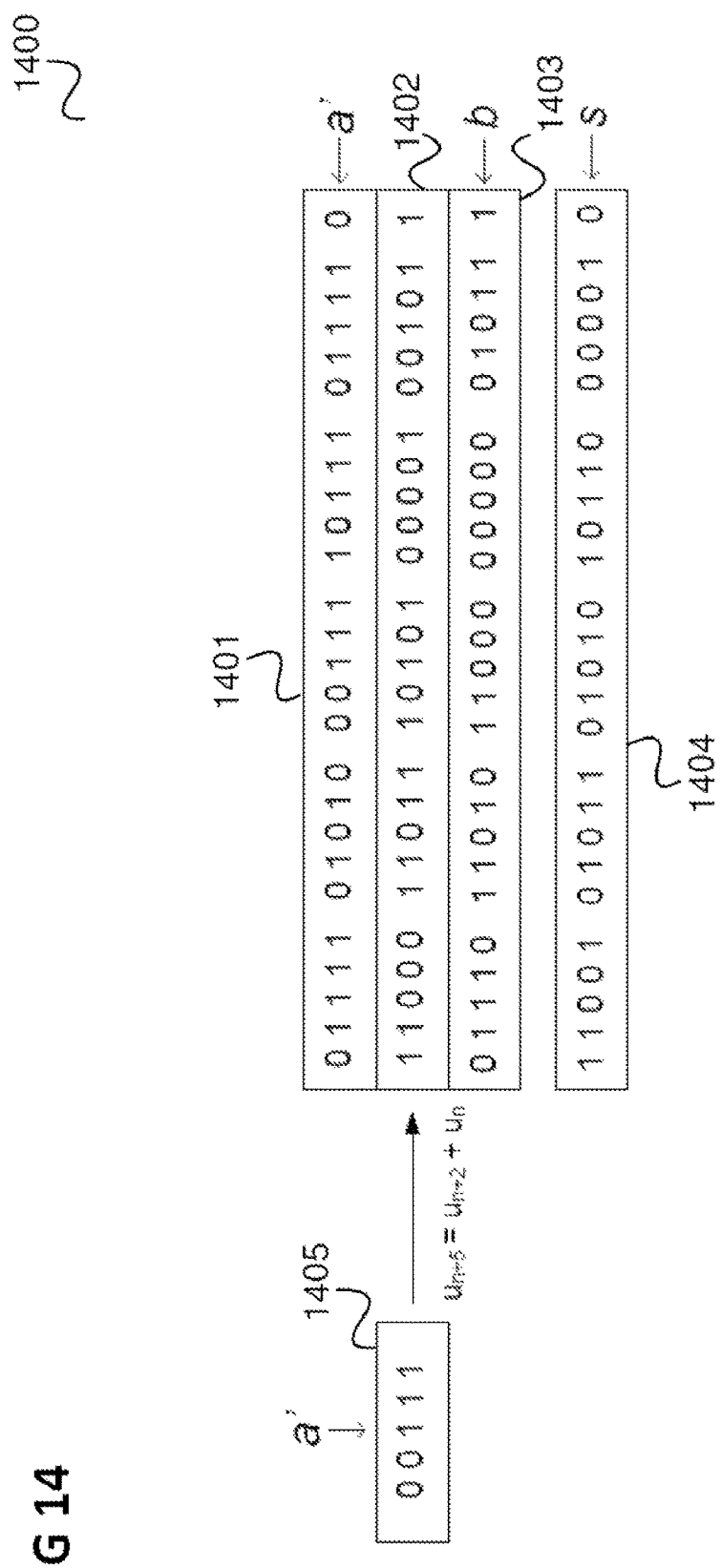
FIG. 14 shows the syndrome calculation for a PUF value.

FIG. 14 illustrates the syndrome calculation for the vector a'.

The syndrome 1404, that is to say the vector s, is given by the sum of a first vector 1401, given by the first 26 bits of a', a second vector 1402 and a third vector 1403. The second vector results from the right-hand five bits 1405 of a' by using the recursion formula $u_{n+5}=u_{n+2}+u_n$, that is to say the last five bits of a' are the five initial values of a 31-bit shift register sequence with the characteristic polynomial $f(x)=x^5+x^2+1$, and the last 26 bits of the shift register sequence are the second vector 1402. The third vector 1403 is the auxiliary vector b.

The vector s can be efficiently calculated with the circuit 1100: initialize the two lower registers, that is to say the register in the left-hand electric circuit 1101 and the register in the right-hand electric circuit 1102 with a', as described above, and initialize the upper register 1104 with b. Close the switch 1104 and clock the electric circuit 26 times. Then, s is situated in the left-hand register.

The Hamming weight of s is then calculated: w(s)=12≥d/2=8

Figure 15:
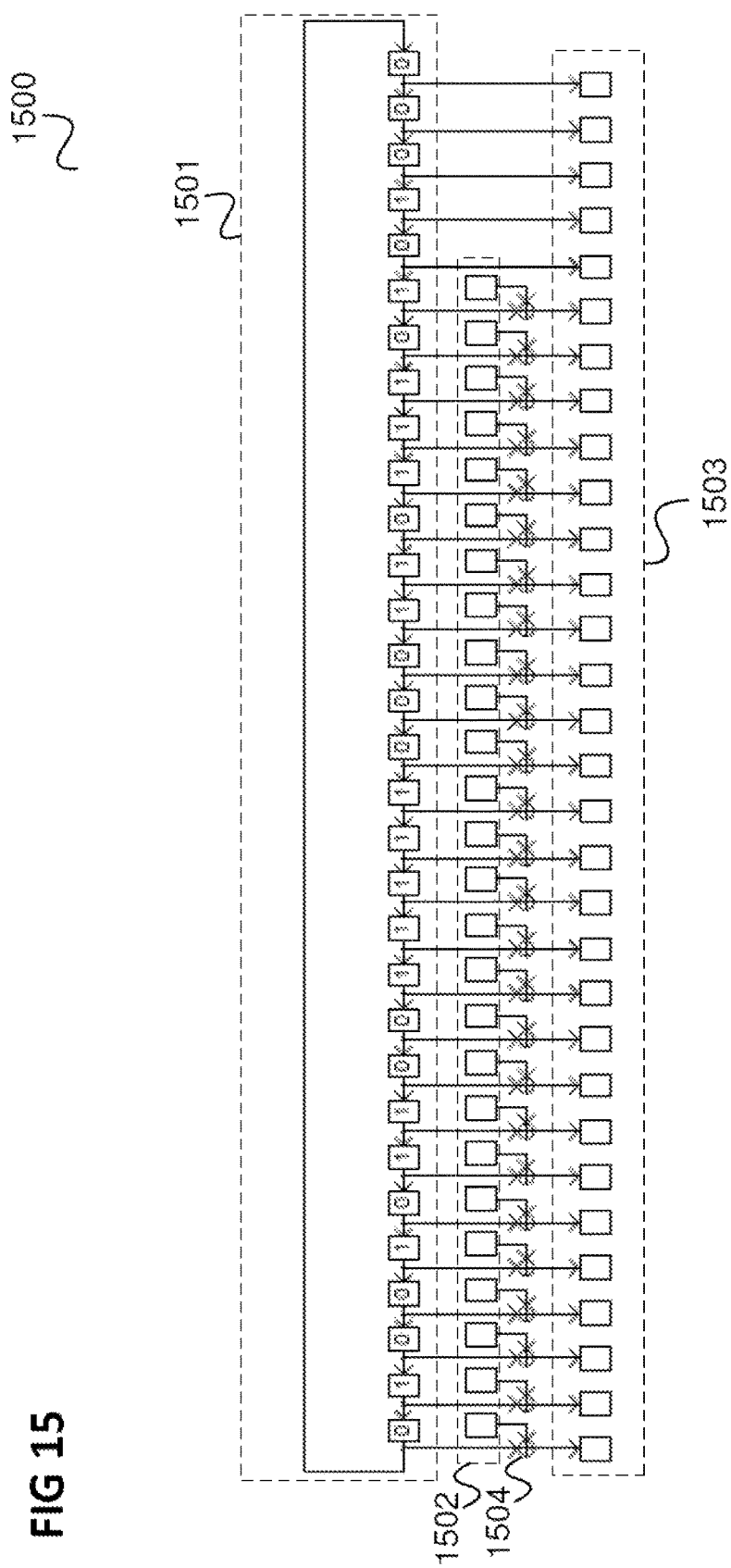
FIG. 15 shows a decoder for PUF reconstruction for the (31, 5, 16) simplex code.

FIG. 15 shows a decoder 1500 for PUF reconstruction for the (31, 5, 16) simplex code.

In a similar manner to the decoder 600, the decoder has three registers 1501, 1502, 1503 and adders 1504, the length and number of which are adapted to the code used in this example.

The decoder 1500 provides the Hamming weights $w_j$=w($E_j$) for j=0, 1, . . . , 30.

min($w_0, w_1, \ldots, w_{30}$, w(s))=min(16, 12, 18, 12, 14, 14, 12, 16, 14, 18, 10, 18, 14, 16, 12, 20, 22, 14, 16, 14, 18, 14, 20, 18, 16, 18, 12, 16, 16, 16, 18, 12)=10.

The minimum 10 is assumed only once: $w_{10}$=10. Therefore, the uniquely determined error vector is e=$E_{10}$.

In order to calculate $E_{10}$ (the vectors $E_0, E_1, \ldots, E_{30}$ which had already been calculated were not stored in order to save storage space, for example), the upper register 1501 of the decoder 1501 (with the initialization value indicated in FIG. 15) is clocked 10 times. The upper register 1501 then contains the vector 11111 00011 01110 10100 00100 10110 0.

The vector in the upper register 1501 is added to the vector s contained in the middle register 1502 and the sum is written to the lower register 1503 (strictly speaking, the first 26 coordinates are added and the last five coordinates are transferred). The lower register 1503 then contains the error vector e=$E_0$=00110 01000 00100 00010 00101 10110 0.

The true PUF value a is a=$a_0$+e=01001 00010 00011 10101 01010 10101 1.

Although the invention has been shown and described, in particular, with reference to particular embodiments, it should be understood by those familiar with the field that numerous changes can be made in terms of the configuration and details without departing from the essence and scope of the invention defined by the following claims. The scope of the invention is therefore determined by the appended claims and it is intended for all changes which fall under the literal sense or equivalence range of the claims to be included.

What is claimed is:

1. A method of increasing data word correctability of a corrupted data word beyond a threshold of half a minimum distance of a code minus one using linear recursion syndrome determination, the method comprising:
   receiving the data word, wherein n is a length of the received data word, and k is a dimension of the code as determined by $n=2^k-1$;
   determining a syndrome, the syndrome comprising a first $2^k-1-k$ sequence elements of the received data word and a second $2^k-1-k$ elements derived according to a linear recursion formula;
   successively generating code words by selecting each of a first $2^k-1-k$ elements to be either 0 or 1 calculating a next $n-2^k-1-k$ elements using a linear recursion formula; forming, for each code word generated, a sum of the syndrome supplemented with zeros to the data word length and the code word, and checking, for the code word, whether the sum of the syndrome supplemented with zeros to the data word length and the code word has a minimum weight among each of the sum of the syndrome supplemented with zeros; and
   determining the error vector as the sum of the syndrome and the code word for which the sum of the syndrome supplemented with zeros to the data word length and the code word has a minimum weight among all code words; and
   correcting the data word using the error vector,
   wherein the minimum distance of the code is a smallest Hamming distance between two code words.

2. The method of claim 1, further comprising:
   outputting the corrected data word to a processing device.

3. The method of claim 1, further comprising:
   receiving the data word from a transmitter.

4. The method of claim 1,
   wherein the syndrome of the error vector is the syndrome of the data word.

5. The method of claim 1,
   wherein the data word is a Physical Unclonable Function word.

6. The method of claim 1, further comprising:
   receiving the data word from a circuit which implements a Physical Unclonable Function.

7. The method of claim 1,
   wherein the syndrome is a sum of the syndrome of the data vector and an auxiliary vector.

8. The method of claim 7,
   wherein the auxiliary vector is the syndrome of a Physical Unclonable Function word which is determined during initialization and differs from the data word by the error vector.

9. The method of claim 1,
   wherein the process of checking whether the sum of the syndrome supplemented to the data word length and the code word has a minimum weight comprises checking whether the weight of the sum is less than half the Hamming distance of the code.

10. The method of claim 1, further comprising:
    aborting the successive generation of words in the set if a code word has been found for which the weight of the sum is less than half the Hamming distance of the code.

11. The method of claim 1,
    wherein the process of checking whether the sum of the syndrome supplemented to the data word length and the word has a minimum weight comprises determining, for all code words generated, the sum of the syndrome supplemented to the data word length and the code word and comparing the determined sums.

12. The method of claim 1, further comprising:
    determining the data word as not being correctable if the sum of the syndrome supplemented with zeros to the data word length and the code word does not have a minimum weight among all code words for a code word.

13. The method of claim 1,
    wherein the syndrome is supplemented with zeros to the data word length according to a control matrix which has just as many unit vectors as the syndrome has components.

14. The method of claim 1,
    wherein the syndrome is supplemented with zeros to the data word length according to a control matrix which has a unit matrix having the number of rows equal to the number of components of the syndrome.

15. The method of claim 13,
    wherein the process of supplementing the syndrome with zeros to the data word length comprises inserting zeros into the syndrome at positions which correspond to columns of the control matrix which are not unit vectors.

16. The method of claim 1,
    wherein the code is a cyclical code.

17. The method of claim 1,
    wherein the code consisting of the zero word and all cyclical interchanges of a code word are not equal to the zero word.

18. The method of claim 1,
    wherein the code words are generated by cyclically interchanging a single code word.

19. The method of claim 1,
    wherein the code is a simplex code.

20. A data processing device for increasing data word correctability of a corrupted data word beyond a threshold of half a minimum distance of a code minus one using linear recursion syndrome determination, the data processing device comprising:
    a syndrome determination circuit configured to receive the data word, wherein n is a length of the received data word, and k is a dimension of the code as determined by $n=2^k-1$ and determine a syndrome, the syndrome comprising a first $2^k-1-k$ sequence elements of the received data word and a second $2^k-1-k$ elements derived according to a linear recursion formula;
    a decoding circuit configured to successively generate code words by selecting each of a first $2^k-1-k$ elements to be either 0 or 1 and calculating a next $n-2^k-1-k$ elements using a linear recursion formula; to form, for each code word generated, a sum of the syndrome supplemented with zeros to the data word length and the code word, and to check, for the code word, whether the sum of the syndrome supplemented with zeros to the data word length and the code word has a minimum weight among all code words; and
    an output circuit configured to output the sum of the syndrome and the code word, for which the sum of the syndrome supplemented with zeros to the data word length and the code word has a minimum weight among all code words, as the error vector; wherein the data word is corrected using the error vector;
    wherein the minimum distance of the code is a smallest Hamming distance between two code words.

* * * * *